(12) United States Patent
Delmas Lascorz et al.

(10) Patent No.: US 11,928,566 B2
(45) Date of Patent: Mar. 12, 2024

(54) SYSTEM AND METHOD FOR OFF-CHIP DATA COMPRESSION AND DECOMPRESSION FOR MACHINE LEARNING NETWORKS

(71) Applicant: THE GOVERNING COUNCIL OF THE UNIVERSITY OF TORONTO, Toronto (CA)

(72) Inventors: Alberto Delmas Lascorz, Toronto (CA); Andreas Moshovos, North York (CA)

( * ) Notice: Subject to any disclaimer, the term of this patent is extended or adjusted under 35 U.S.C. 154(b) by 0 days.

(21) Appl. No.: 18/153,079

(22) Filed: Jan. 11, 2023

(65) Prior Publication Data

US 2023/0267376 A1 Aug. 24, 2023

Related U.S. Application Data

(60) Provisional application No. 63/300,720, filed on Jan. 19, 2022.

(51) Int. Cl.
*H03M 7/00* (2006.01)
*G06N 20/00* (2019.01)
*H03M 7/30* (2006.01)

(52) U.S. Cl.
CPC .............. *G06N 20/00* (2019.01); *H03M 7/30* (2013.01); *H03M 7/6029* (2013.01)

(58) Field of Classification Search
CPC ....... G06N 20/00; H03M 7/30; H03M 7/6029
USPC .............................................. 341/60, 50, 51
See application file for complete search history.

(56) References Cited

U.S. PATENT DOCUMENTS

| 10,491,240 B1 * | 11/2019 | Dupont ............... G06F 16/9014 |
| 10,511,324 B1 * | 12/2019 | Goyal ................. H03M 7/4006 |
| 2019/0356330 A1 * | 11/2019 | Minnen .................... G06N 7/01 |
| 2020/0007158 A1 * | 1/2020 | Cooper .................... H03M 7/40 |
| 2020/0186164 A1 | 6/2020 | Marpe et al. |
| 2021/0126650 A1 | 4/2021 | Kirchhoffer et al. |
| 2021/0382854 A1 * | 12/2021 | Cooper ................. G06F 3/0641 |

OTHER PUBLICATIONS

International Search Report for PCT application No. PCT/CA2023/050025, search completed: Mar. 8, 2023, dated Mar. 29, 2023.

(Continued)

*Primary Examiner* — Jean B Jeanglaude
(74) *Attorney, Agent, or Firm* — Bhole IP Law; Anil Bhole; Marc Lampert

(57) ABSTRACT

There is provided a system and method for compression and decompression of a data stream used by machine learning networks. The method including: encoding each value in the data stream, including: determining a mapping to one of a plurality of non-overlapping ranges, each value encoded as a symbol representative of the range and a corresponding offset; and arithmetically coding the symbol using a probability count; storing a compressed data stream including the arithmetically coded symbols and the corresponding offsets; and decoding the compressed data stream with arithmetic decoding using the probability count, the arithmetic decoded symbols use the offset bits to arrive at a decoded data stream; and communicating the decoded data stream for use by the machine learning networks.

22 Claims, 14 Drawing Sheets

(56) References Cited

OTHER PUBLICATIONS

Written Opinion of the International Searching Authority for PCT application No. PCT/CA2023/050025, opinion completed: Mar. 10, 2023, dated Mar. 29, 2023.

"DDR4 Power Calculator 4.0", Micron Technology, https://www.micron.com/_/media/documents/products/powercalculator/ddr4 power calc.xlsm.

"IntelAI at GitHub: Models/benchmarks at master", IntelAI, [Online]. Available: https://github.com/IntelAI/models/tree/master/benchmarks.

"Kaggle display advertising challenge.", [Online]. Available: https://www.kaggle.com/c/criteo-display-ad-challenge/data.

"NLP Architect by Intel AI Lab", Nov. 2018. [Online]. Available: https://doi.org/10.5281/zenodo.1477518.

"Torchvision.", [Online]. Available: https://pytorch.org/vision/stable/index.html.

Badrinarayanan, V. , et al., "SegNet: A Deep Convolutional Encoder-Decoder Architecture for Image Segmentation.", IEEE Transactions on Pattern Analysis and Machine Intelligence, 2017. DOI: 10.1109/TPAMI.2016.2644615.

Brostow, Gabriel J. , et al., "Semantic object classes in video: A high-definition ground truth database", Pattern Recognition Letters, vol. 30, No. 2, pp. 88-97, 2009, video-based Object and Event Analysis. doi:10.1016/j.patrec.2008.04.005 [Online]. Available: http://www.sciencedirect.com/science/article/pii/S0167865508001220.

Cavigelli, L. , et al., "Extended Bit-Plane Compression for Convolutional Neural Network Accelerators.", in Proc. IEEE AICAS, 2018. https://doi.org/10.3929/ethz-b-000376559.

Chen, Yu-Hsin. , et al., "Eyeriss: A Spatial Architecture for Energy-Efficient Dataflow for Convolutional Neural Networks", in 2016 ACM/IEEE 43rd Annual International Symposium on Computer Architecture (ISCA), 2016, pp. 367-379. DOI: 10.1109/ISCA.2016.40.

Chen, Yu-Hsin , et al., "Eyeriss: An Energy-Efficient Reconfigurable Accelerator for Deep Convolutional Neural Networks", in IEEE International Solid-State Circuits Conference, ISSCC 2016, Digest of Technical Papers, 2016, pp. 262-263. DOI: 10.1109/JSSC.2016.2616357.

Chen, Tianqi , et al., "TVM: An Automated End-to-End Optimizing Compiler for Deep Learning", in Proceedings of the 13th USENIX Conference on Operating Systems Design and Implementation, ser. OSDI'18. USA: USENIX Association, 2018, p. 579-594. arXiv:1802.04799v3.

Cheng, H. T. , et al., "Wide & Deep Learning for Recommender Systems", Google Inc. 2016. DOI: http://dx.doi.org/10.1145/2988450.2988454.

Choi, Jungwook , et al., "PACT: parameterized clipping activation for quantized neural networks", CoRR, vol. abs/1805.06085, 2018. [Online]. Available: http://arxiv.org/abs/1805.06085.

Dally, Bill , "Power, Programmability, and Granularity: The Challenges of ExaScale Computing", in 2011 IEEE International Parallel Distributed Processing Symposium, May 2011, pp. 878-878.

Delmás Lascorz, Alberto , et al., "Shapeshifter: Enabling fine-grain data width adaptation in deep learning", in Proceedings of the 52Nd Annual IEEE/ACM International Symposium on Microarchitecture, ser. Micro '52. New York, NY, USA: ACM, 2019, pp. 28-41. [Online]. Available: http://doi.acm.org/10.1145/3352460.3358295.

Delmás Lascorz,, Alberto , et al., "Tartan: Accelerating Fully-Connected and Convolutional Layers in Deep Learning Networks by Exploiting Numerical Precision Variability", CoRR, vol. abs/1707.09068, 2017. [Online]. Available: http://arxiv.org/abs/1707.09068.

Devlin, Jacob , et al., "BERT: Pre-training of Deep Bidirectional Transformers for Language Understanding", CoRR, vol. abs/1810.04805, 2018. [Online]. Available: http://arxiv.org/abs/1810.04805.

Durant, Luke , et al., "Nvidia developer blog / Inside Volta: The World's Most Advanced Data Center GPU", May 2017. [Online]. Available: https://devblogs.nvidia.com/inside-volta/.

Edo Vivancos, Isak , et al., "Boveda: Building an on-chip deep learning memory hierarchy brick by brick", Mar. 2021. [Online]. Available: https://proceedings.mlsys.org/paper/2021/hash/013d407166ec4fa56eb1e1f8cbe183b9-Abstract.html.

Gholami, Amir , et al., "A Survey of Quantization Methods for Efficient Neural Network Inference", CoRR, vol. abs/2103.13630, 2021. [Online]. Available: https://arxiv.org/abs/2103.13630.

Han, Song , et al., "Deep Compression: Compressing Deep Neural Networks with Pruning, Trained Quantization and Huffman Coding.", Published as a conference paper at ICLR 2016, arXiv:1510.00149 [cs], Oct. 2015, arXiv: 1510.00149. [Online]. Available: http://arxiv.org/abs/1510.00149.

Han, Song , et al., "EIE: Efficient Inference Engine on Compressed Deep Neural Network", in 43rd ACM/IEEE Annual International Symposiumon Computer Architecture, ISCA 2016, Seoul, South Korea, Jun. 18-22, 2016, 2016, pp. 243-254. DOI: 10.1109/ISCA.2016.30.

Harper, F. Maxwell , et al., "The MovieLens Datasets: History and Context", ACM Trans. Interact. Intell. Syst., vol. 5, No. 4, Dec. 2015. [Online]. Available: https://doi.org/10.1145/2827872.

He, Kaiming , et al., "Deep residual learning for image recognition", CoRR, vol. abs/1512.03385, 2015. [Online]. Available: http://arxiv.org/abs/1512.03385.

He, Xiangnan , et al., "Neural collaborative filtering", Proceedings of the 26th International Conference on World Wide Web, ser. WWW '17. Republic and Canton of Geneva, CHE: International World Wide Web Conferences Steering Committee, 2017, p. 173-182. [Online]. Available: https://doi.org/10.1145/3038912.3052569.

Horowitz, Mark , "1.1 computing's energy problem (and what we can do about it)", 2014 IEEE International Solid-State Circuits Conference Digest of Technical Papers (ISSCC). vol. 57, 02 2014, pp. 10-14. https://doi.org/10.1109/isscc.2014.6757323.

Howard, Andrew G. , et al., "MobileNets: Efficient Convolutional Neural Networks for Mobile Vision Applications", CoRR, vol. abs/1704.04861, 2017. [Online]. Available: http://arxiv.org/abs/1704.04861.

Howard, Paul G. , et al., "Practical implementations of arithmetic coding", The Kluwer International Series in Engineering and Computer Science, p. 85-112, 1992.

Howard, Andrew , et al., "Searching for MobileNetV3", 2019 IEEE/CVF International Conference on Computer Vision (ICCV). https://doi.org/10.1109/iccv.2019.00140.

Jang, Jun-Woo , et al., "Sparsity-aware and re-configurable npu architecture for samsung flagship mobile soc", in 2021 ACM/IEEE 48th Annual International Symposium on Computer Architecture (ISCA), 2021, pp. 15-28. DOI: 10.1109/ISCA52012.2021.00011.

Jia, Zhe. , et al., "Dissecting the NVIDIA volta GPU architecture via microbenchmarking", CoRR, vol. abs/1804.06826, 2018. [Online]. Available: http://arxiv.org/abs/1804.06826.

Jouppi, Norman. P. , et al., "In-Datacenter Performance Analysis of a Tensor Processing Unit", in Proceedings of the 44th Annual International Symposium on Computer Architecture, ser. ISCA '17. New York, NY, USA: ACM, 2017, pp. 1-12. [Online]. Available: http://doi.acm.org/10.1145/3079856.3080246.

Judd, Patrick , et al., "Proteus: Exploiting numerical precision variability in deep neural networks", in Workshop on Approximate Computing (WAPCO), 2016. DOI: http://dx.doi.org/10.1145/2925426.2926294.

Langdon, Glen G. , "An introduction to arithmetic coding", IBM Journal of Research and Development, vol. 28, No. 2, pp. 135-149, 1984.

Lin, Tsung-Yi , et al., "Microsoft COCO: Common Objects in Context", ECCV 2014, 740-755. https://doi.org/10.1007/978-3-319-10602-1_48.

Liu, Shaoli , et al., "Cambricon: An instruction set architecture for neural networks", in 2016 ACM/IEEE 43rd Annual International Symposium on Computer Architecture (ISCA), 2016, pp. 393-405. DOI: 10.1109/ISCA.2016.42.

Liu, Wei , et al., "SSD: Single Shot MultiBox Detector", Lecture Notes in Computer Science, p. 21-37, 2016. [Online]. Available: http://dx.doi.org/10.1007/978-3-319-46448-0 2.

(56) References Cited

OTHER PUBLICATIONS

Lu, Xin, et al., "Object detection based on SSD-resnet", in 2019 IEEE 6th International Conference on Cloud Computing and Intelligence Systems (CCIS), 2019, pp. 89-92. DOI: 10.1109/ccis48116.2019.9073753.

Ma, Ningning, et al., "ShuffleNet V2: Practical Guidelines for Efficient CNN Architecture Design", Computer Vision—ECCV 2018, 122-138. https://doi.org/10.1007/978-3-030-01264-9_8.

Nelson, Mark, et al., "Arithmetic Coding+Statistical Modeling= Data Compression", Dr. Dobb's Journal, vol. Feb. 1991.

Nguyen, Quang-Linh, et al., "Efficient Binary Arithmetic Encoder for HEVC with Multiple Bypass Bin Processing", in 2017 7th International Conference on Integrated Circuits, Design, and Verification (ICDV), 2017, pp. 82-87. DOI: 10.1109/icdv.2017.8188644.

Nikolić, Miloš, et al., "BitPruning: Learning Bitlengths for Aggressive and Accurate Quantization", 2020. https://doi.org/10.48550/arXiv.2002.03090.

Nikolić, Miloš, et al., "Characterizing Sources of Ineffectual Computations in Deep Learning Networks", in 2019 IEEE International Symposium on Performance Analysis of Systems and Software (ISPASS), 2019, pp. 165-176. DOI: 10.1109/ISPASS.2019.00030.

Parashar, Angshuman, et al., "SCNN: An Accelerator for Compressed-sparse Convolutional Neural Networks", in Proceedings of the 44th Annual International Symposium on Computer Architecture, ser. ISCA '17. New York, NY, USA: ACM, 2017, pp. 27-40. [Online]. Available: http://doi.acm.org/10.1145/3079856.3080254.

Park, Eunhyeok, et al., "Energy-efficient neural network accelerator based on outlier-aware low-precision computation", in ISCA. IEEE Computer Society, 2018, pp. 688-698. DOI:10.1109/ISCA.2018.00063.

Rashtchian, Cyrus, et al., "Collecting image annotations using amazon's mechanical turk", in Proceedings of the NAACL HLT 2010 Workshop on Creating Speech and Language Data with Amazon's Mechanical Turk, ser. CSLDAMT '10. pp. 139-147. [Online]. Available: http://dl.acm.org/citation.cfm?id=1866696.1866717.

Reddi, Vijay Janapa, et al., "MLPerf Inference Benchmark", 2020 ACM/IEEE 47th Annual International Symposium on Computer Architecture (ISCA). https://doi.org/10.1109/isca45697.2020.00045.

Rhu, Minsoo, et al., "Compressing DMA engine: Leveraging activation sparsity for training deep neural networks", in IEEE International Symposium on High Performance Computer Architecture, HPCA 2018, Vienna, Austria, Feb. 24-28, 2018, 2018, pp. 78-91. [Online]. Available: https://doi.org/10.1109/HPCA.2018.00017.

Rissanen, J., et al., "Arithmetic coding", IBM Journal of Research and Development, vol. 23, No. 2, pp. 149-162, 1979.

Rissanen, J. J., "Generalized kraft inequality and arithmetic coding", IBM Journal of Research and Development, vol. 20, No. 3, pp. 198-203, 1976. DOI: 10.1147/rd.203.0198.

Russakovsky, Olga, et al., "ImageNet Large Scale Visual Recognition Challenge", arXiv:1409.0575 [cs], Sep. 2014, arXiv: 1409.0575.

Sandler, Mark, et al., "Inverted residuals and linear bottlenecks: Mobile networks for classification, detection and segmentation", CoRR, vol. abs/1801.04381, 2018. [Online]. Available: http://arxiv.org/abs/1801.04381.

Siu, Kevin, et al., "Memory requirements for convolutional neural network hardware accelerators", 2018 IEEE International Symposium on Workload Characterization (IISWC). https://doi.org/10.1109/iiswc.2018.8573527.

Szegedy, Christian, et al., "Going deeper with convolutions", in 2015 IEEE Conference on Computer Vision and Pattern Recognition (CVPR), 2015, pp. 1-9. arXiv:1409.4842v1.

Szegedy, Christian, et al., "Inception-v4, Inception-ResNet and the Impact of Residual Connections on Learning", 2016. Proceedings of the AAAI Conference on Artificial Intelligence, 31(1). https://doi.org/10.1609/aaai.v31i1.11231.

Szegedy, Christian, et al., "Rethinking the inception architecture for computer vision", (2015/2016). 2016 IEEE Conference on Computer Vision and Pattern Recognition (CVPR). https://doi.org/10.1109/cvpr.2016.308.

Wang, Alex, et al., "Glue: A multi-task benchmark and analysis platform for natural language understanding", CoRR, vol. abs/1804.07461, 2018. [Online]. Available: http://arxiv.org/abs/1804.07461.

Wang, Cheng, et al., "Image captioning with deep bidirectional lstms", in Proceedings of the 2016 ACM on Multimedia Conference. ACM, 2016, pp. 988-997. DOI: http://dx.doi.org/10.1145/2964284.2964299.

Xie, Saining, et al., "Aggregated residual transformations for deep neural networks", arXiv preprint arXiv:1611.05431, 2016.

Yang, Tien-Ju, et al., "Designing Energy-Efficient Convolutional Neural Networks using Energy-Aware Pruning", 2017 IEEE Conference on Computer Vision and Pattern Recognition (CVPR). https://doi.org/10.1109/cvpr.2017.643.

Yoo, Youngjun, et al., "Embedded image-domain compression using context models", in Proceedings 1999 International Conference on Image Processing (Cat. 99CH36348), vol. 1, 1999, pp. 477-481 vol.1. https://doi.org/10.1109/icip.1999.821655.

Zmora, Neta, et al., "Neural network distiller", Jun. 2018. [Online]. Available: https://doi.org/10.5281/zenodo.1297430.

* cited by examiner

SYSTEM AND METHOD FOR OFF-CHIP DATA COMPRESSION AND DECOMPRESSION FOR MACHINE LEARNING NETWORKS

TECHNICAL FIELD

The following relates, generally, to data compression techniques; and more particularly, to a system and method for off-chip data compression and decompression for machine learning networks.

BACKGROUND

Data compression in the memory hierarchy is appealing for deep learning (DL) workloads and accelerators where memory accesses are responsible for a large fraction of overall energy consumption. First, data compression at any level of the hierarchy can potentially boost its effective capacity by encoding each value using fewer bits. Second, it can improve effective latency and energy efficiency by reducing the slower and more energy demanding accesses to higher levels of the hierarchy including those to off-chip memory. Third, compression can reduce the number of bits that are read or written per value, boosting effective bandwidth and energy efficiency. Finally, compression naturally complements dataflow and blocking for data reuse, which are the front-line techniques for boosting energy efficiency in the memory hierarchy for deep learning.

SUMMARY

In an aspect, there is provided a method for compression and decompression of a data stream used by machine learning networks, the data stream comprising weight data or activation data used by the machine learning networks, the method comprising: receiving the data stream to be encoded; encoding each value in the data stream, comprising: determining a mapping to one of a plurality of non-overlapping ranges, each value encoded as a symbol representative of the range and a corresponding offset; and arithmetically coding the symbol using a probability count; storing a compressed data stream comprising the arithmetically coded symbols and the corresponding offsets; and decoding the compressed data stream with arithmetic decoding using the probability count, the arithmetic decoded symbols are used with the offset bits to arrive at a decoded data stream; and communicating the decoded data stream for use by the machine learning networks.

In a particular case of the method, the probability count is represented by a range of values representing an approximate frequency of occurrence for the symbol in an input sample.

In another case of the method, the probability counts are initialized with a uniform value distribution.

In yet another case of the method, probability count in the input sample is used to determine the non-overlapping ranges.

In yet another case of the method, encoding each value in the data stream comprises encoding multiple values simultaneously using pipelining, and wherein decoding the compressed data stream comprises decoding multiple values simultaneously using pipelining.

In yet another case of the method, the data stream comprises a tensor and wherein the method further comprises splitting the tensor into several subtensors, each subtensor encoded and decoded in a respective pipeline.

In yet another case of the method, the method further comprising encoding the corresponding offsets using two-level encoding.

In yet another case of the method, each of the non-overlapping ranges is defined by a respective minimum value, maximum value, and offset length.

In yet another case of the method, the non-overlapping ranges are ordered and the maximum value of each range is the minimum value minus one of the next range in the order.

In yet another case of the method, the symbol comprises a minimum value for the mapped range, and wherein the corresponding offset comprises the minimum value for the mapped range subtracted from the value from the data stream.

In yet another case of the method, encoding each value in the data stream comprises using profiling to determine the probability counts for activation data.

In another aspect, there is provided a system for compression and decompression of a data stream used by machine learning networks, the data stream comprising weight data or activation data used by the machine learning networks, the system comprising: one or more encoders to receive the data stream to be encoded and encode each value in the data stream, the encoding comprising: determining a mapping to one of a plurality of non-overlapping ranges, each value encoded as a symbol representative of the range and a corresponding offset; and arithmetically coding the symbol using a probability count; a memory storage for storing a compressed data stream comprising the arithmetically coded symbols and the corresponding offsets; and one or more decoders to decode the compressed data stream with arithmetic decoding using the probability count, the decoder uses the arithmetic decoded symbols and the offset bits to arrive at a decoded data stream, and to communicate the decoded data stream for use by the machine learning networks.

In a particular case of the system, the probability count is represented by a range of values representing an approximate frequency of occurrence for the symbol in an input sample.

In another case of the system, the probability counts are initialized with a uniform value distribution.

In yet another case of the system, probability count in the input sample is used to determine the non-overlapping ranges.

In yet another case of the system, multiple values in the data stream are encoded simultaneously by each of a plurality of the encoders, and wherein multiple values in the compressed data stream are decoded simultaneously by each of a plurality of the decoders.

In yet another case of the system, the data stream comprises a tensor and wherein the method further comprises splitting the tensor into several subtensors, each subtensor encoded by a separate encoder and decoded by a separate decoder.

In yet another case of the system, the encoder further encodes the corresponding offsets using two-level encoding.

In yet another case of the system, each of the non-overlapping ranges is defined by a respective minimum value, maximum value, and offset length.

In yet another case of the system, the symbol comprises a minimum value for the mapped range, and wherein the corresponding offset comprises the minimum value for the mapped range subtracted from the value from the data stream.

In yet another case of the system, the non-overlapping ranges are ordered and the maximum value of each range is the minimum value minus one of the next range in the order.

In yet another case of the system, the encoder encodes each value in the data stream using profiling to determine the probability counts for activation data.

These and other aspects are contemplated and described herein. It will be appreciated that the foregoing summary sets out representative aspects of the system and method to assist skilled readers in understanding the following detailed description.

DESCRIPTION OF THE DRAWINGS

A greater understanding of the embodiments will be had with reference to the Figures, in which.

DETAILED DESCRIPTION

Figure 1:
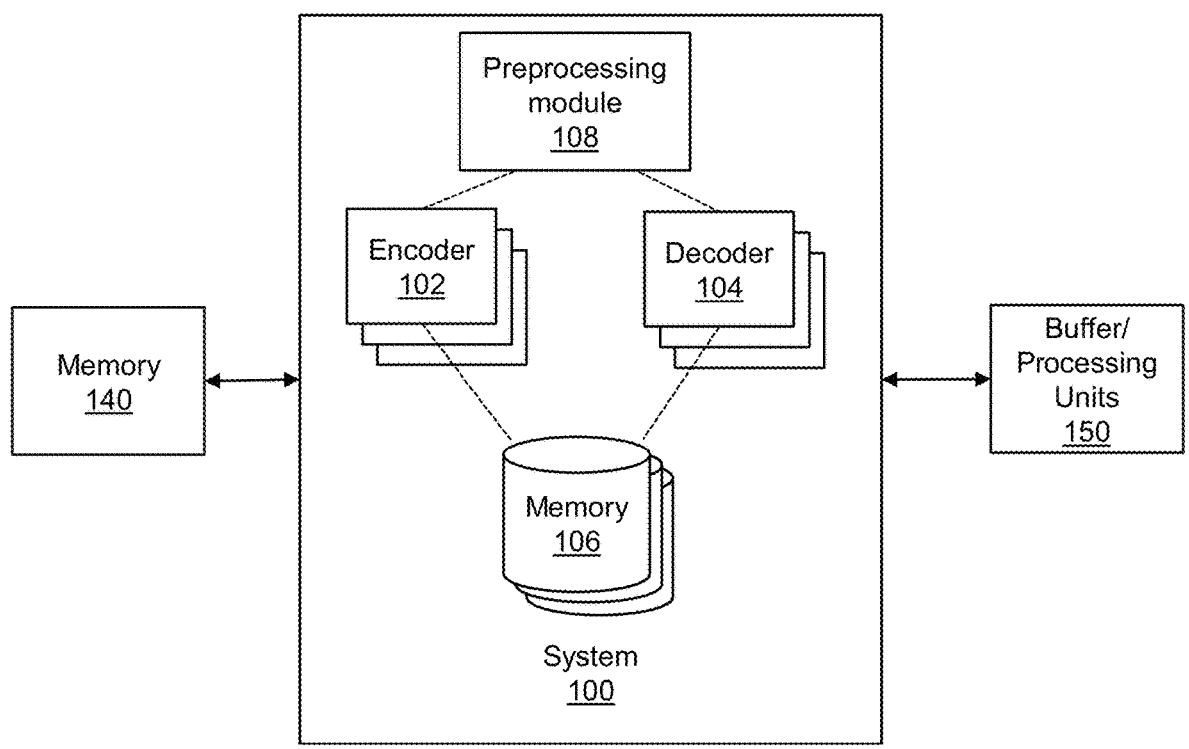
FIG. 1 shows a block diagram for a system for compression and decompression of a data stream used by machine learning networks, according to an embodiment.

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practised without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender. Further definitions for terms may be set out herein; these may apply to prior and subsequent instances of those terms, as will be understood from a reading of the present description.

Any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

Since off-chip accesses are generally more than an order of magnitude costlier than on-chip accesses (e.g., an older technology node accessing 32b from DRAM costs 640pj vs. 5pj from an 8 KB SRAM), compression methods for neural networks generally have targeted primarily off-chip accesses. These successes in compression have increased the relative energy cost of on-chip accesses. For example, some approaches quantize the parameters (weights) into a 16-entry dictionary of 16-bit values, which are then encoded using Huffman encoding. These approaches require additional training steps and targets only the weights of a mode. Other approaches target zeros, while others also target prefixes of 0s or 1s. These approaches either place additional constraints on the values of the weights while not compressing activations, or target specific expected value patterns. Advantageously, embodiments of the present disclosure exploit any non-uniform behavior in the value distribution of weights and values. Arithmetic Coding (AC) is built with a lossless data encoding/decoding approach that can, in some cases, achieve nearly optimal encoding efficiency. Using AC for machine learning workloads requires overcoming substantial challenges because: (1) AC implementations tend to be costly, requiring expensive operations such as division, and (2) AC is sequential in nature, which is at odds with the wide, and high-bandwidth, needs of target workloads.

Embodiments of the present disclosure provide a lossless off-chip memory compression approach that can be directly compatible with any accelerator. For example, this includes SIMD units such as those used in graphics processors including Tensorcores, systolic-arrays such as those of the TPU family, grid-like processing units without or with support for sparsity such as SCNN.

Turning to FIG. 1, shown is a diagram for a system 100 for off-chip data compression and decompression for machine learning networks, according to an embodiment. The system 100 comprises a plurality of encoder 102 and decoder 104 dedicated hardware circuits, each in communication with one or more memory units 106 (such as a register) comprising a transitory or non-transitory computer-readable medium. In further cases, the system 100 can be implemented on a processor, microprocessor, microcontroller, other integrated circuits, or the like. The system 100 may include other components as applicable or suitable, such as a local bus enabling the encoder 102 and decoder 104 dedicated hardware circuits to receive input (such as from shared memory 140), communicate with the memory units 106, and output the encoding/decoding (such as to a buffer and/or processing units 150). In some cases, the system 100 can include a preprocessing module 108 in communication with the encoder 102 and the decoder 104, and with the input.

Figure 2:
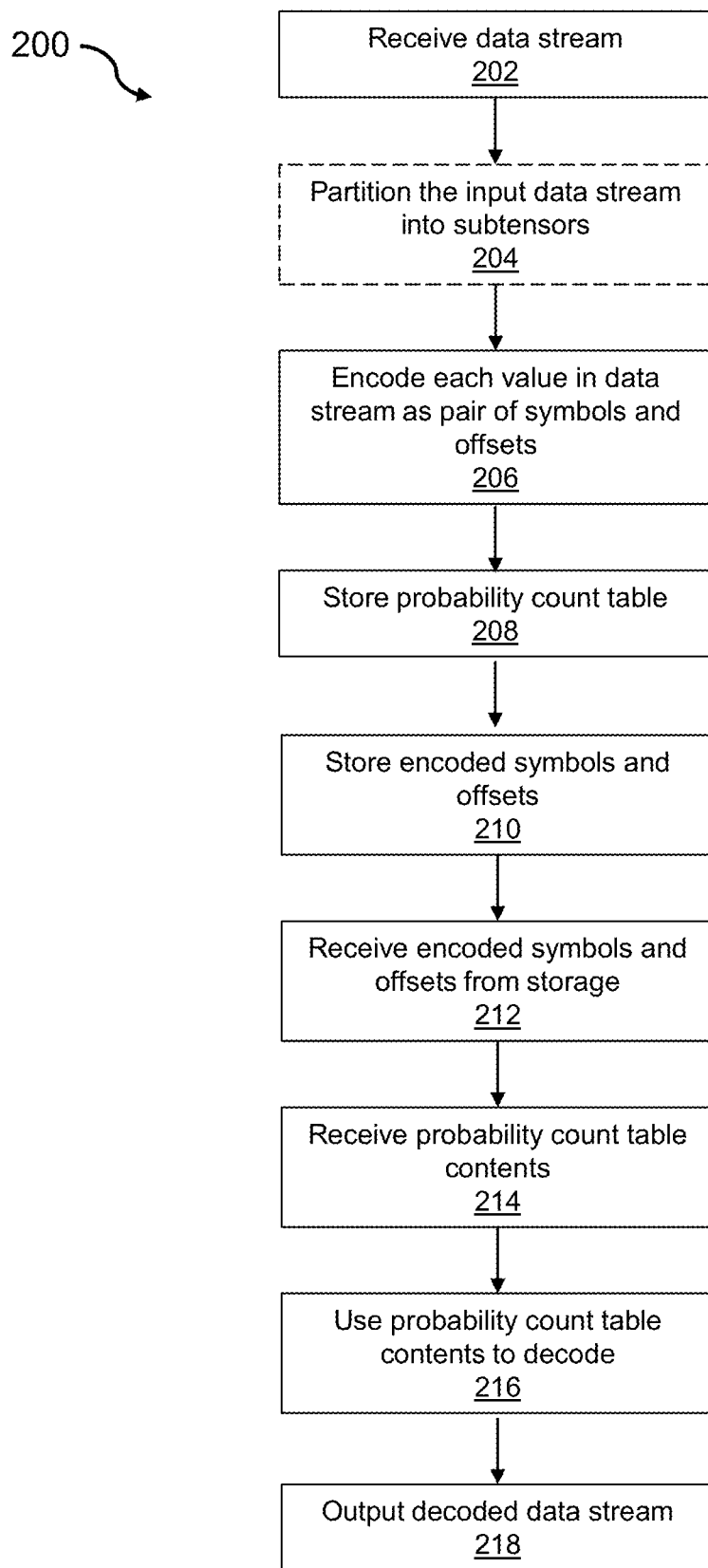
FIG. 2 shows a diagrammatic flowchart for a method for compression and decompression of a data stream used by machine learning networks, according to an embodiment.

The system 100 executes a method for chip memory compression for fixed-point quantized models. The method reduces data widths by exploiting non-uniform value distributions in deep learning applications. In this way, the method can be used to increase the effective memory capacity, to reduce off-chip traffic, and/or to achieve the desired performance/energy targets while using smaller off-chip memories. Turning to FIG. 2, shown therein is a flowchart for a method 200 for off-chip data compression and decompression for machine learning networks.

At block 202, a data stream is received from the buffers of the processing units 150, or the processing units themselves. The processing units undertaking execution of the machine learning networks. The values in the data stream can include weights and/or activation related data for the machine learning networks, for example, in the form of tensors.

Figure 3:
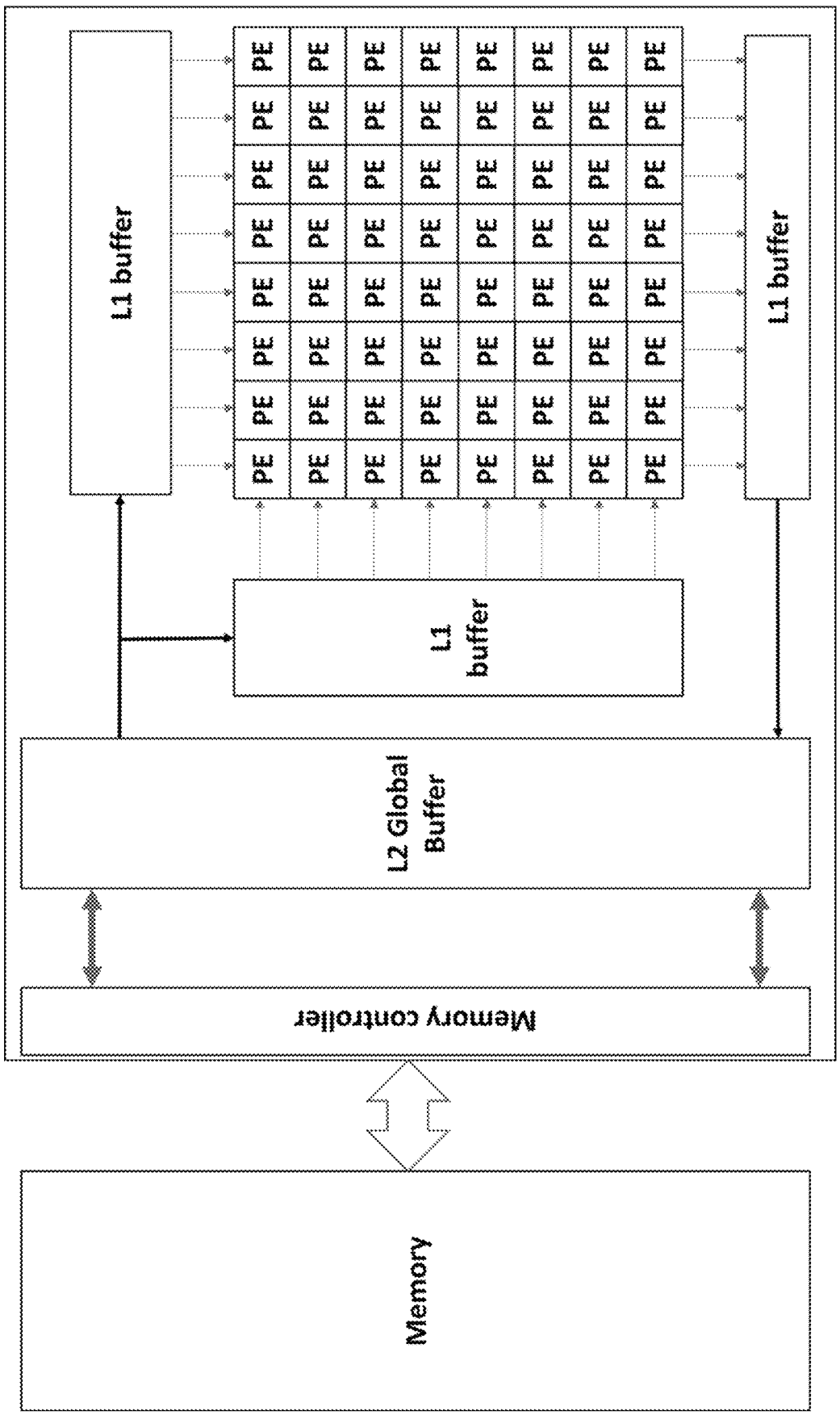
FIG. 3 shows a block diagram of an example systolic-array accelerator.
Figure 4:
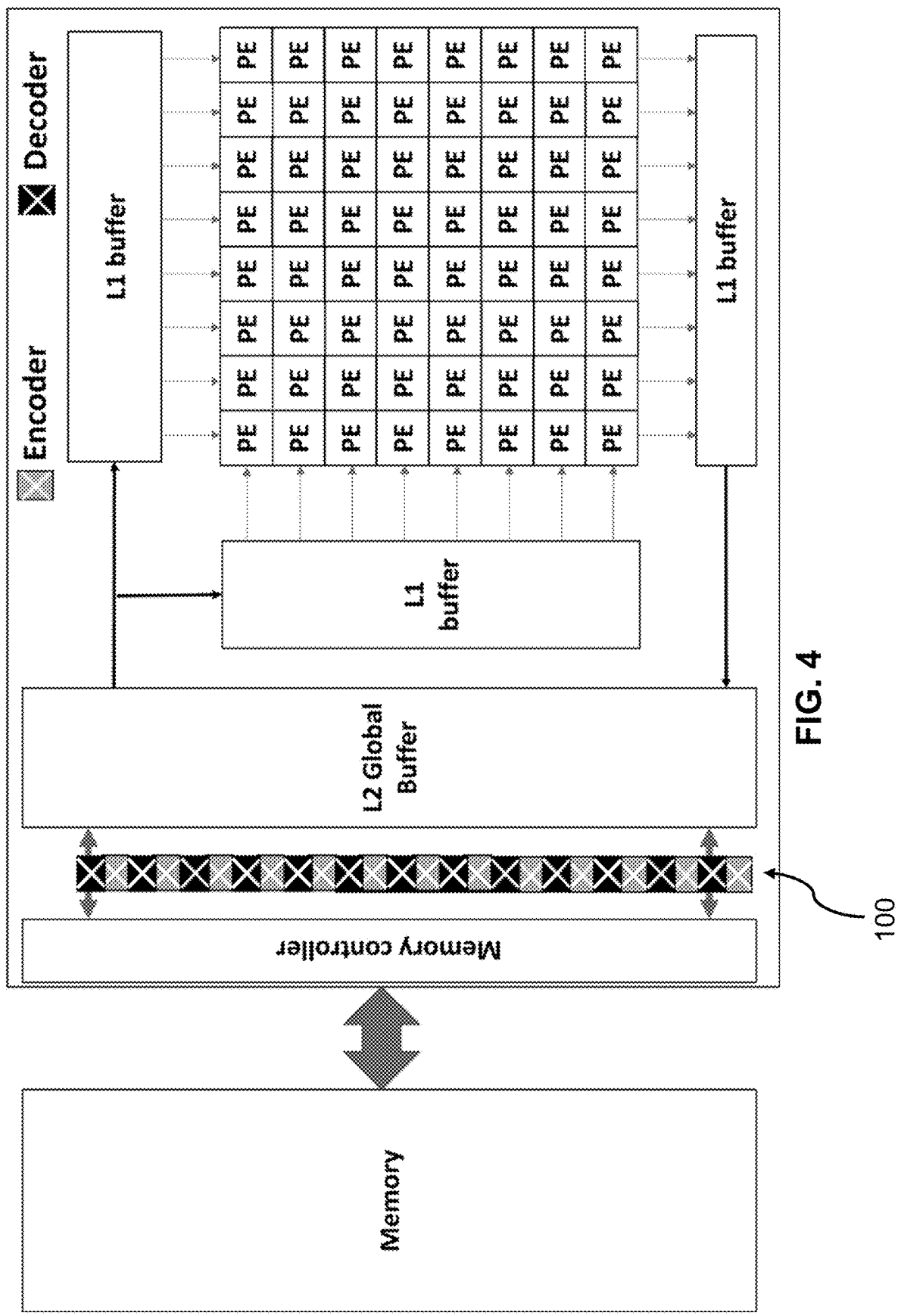
FIG. 4 shows a block diagram of another example systolic-array accelerator using the system of FIG. 1.

FIG. 3 shows an example of a systolic-array accelerator, while FIG. 4 shows an example of a systolic-array accelerator with the system 100 positioned between the on-chip and the off-chip memory hierarchies and the processing units; where it decodes and encodes values as they are being read or written from off-chip. The system 100 can work with any desired dataflow transparently packing data in memory so that it can be fed into the corresponding units with relatively little cost. The system 100 uses several encoder and decoder units to potentially sustain high concurrency and wide datawidth accesses. The off-chip memory hierarchy generally still sees regular streams of wide accesses, albeit ones containing fewer accesses. The off-chip accesses generally remain as wide as they were without the system 100 in place. The on-chip memory hierarchy and the processing units generally are exposed to the original value; except for differences in timing when accessing the off-chip memory system, and thus, the system 100 can be plug-in compatible and practically transparent.

To achieve high compression ratio, the encoder 102 makes use of naturally occurring data value distributions of machine learning workloads. Rather than targeting specific cases, such as zeros, or prefixes of 0s or 1s, as targeted by other approaches, the encoder 102 instead uses the fact that the distributions are far from uniform. For example, as described herein, the values, seen in binary form, often tend to be heavily clustered near two extremes, a high and a low, such as values of all 0s or all 1s. This does not mean that the values are necessarily all 0s or all 1s, just that the values tend to be close (when ordered in numerical order) to those two patterns. While this approach may share some similarities to Arithmetic Coding, which can seamlessly exploit any non-uniformity in the value distribution, Arithmetic Coding implementations are generally of high cost and typically of low bandwidth. Arithmetic Coding generally use high cost operations, such as division, and such implementations often process one input value during encoding, and produce a few bits at a time during decompression. However, such limitations are not suitable for the circumstances of use of the system 100. In contrast, the system 100 deploys a light-weight approach where energy efficiency benefits from compressing data far outweigh the costs of performing the compression/decompression. Additionally, in contrast to Arithmetic Coding, the system 100 can handle machine learning workloads that are typically highly data parallel; thus favoring multiple, wide data accesses that translate into high bandwidth memory system needs. In this way, the system 100 can achieve the benefits possible with Arithmetic Coding while enabling a low cost, highly concurrent, and high bandwidth implementation.

As illustrated in the example of FIG. 4, in some cases, the system 100 can introduce a plurality of decoder and encoder units that translate the data as it goes off-chip and comes from off-chip. In the example of FIG. 4, the rest of the accelerator, including the memory hierarchy, can still observe the same sequence of data coming in and can still write the data in the way they would otherwise. In this case, the system 100 only alters the data content as it is transferred from/to off-chip; and thus, is a lossless approach.

At block 206, each encoder 102 encodes a received incoming value v from the data stream as a pair of (symbol, offset), where v=symbol+offset. The symbol is a bit prefix of the original value v. For example, assuming 8 bit data, it is of the form $b_7 \ldots b_s 0 \ldots 0$. The encoder 102 encodes an input data stream, comprising a tensor, into two streams, one containing a symbol sequence, and another containing a corresponding offset. Arithmetic coding can be used on the symbol stream. The arithmetic coding can use a probability count and symbol assignment table (referred to as a probability count table) that is derived statically. At block 208, the encoder can store the probability count table in memory 106. Each probability count represents a range of values instead of individual values; which contributes to achieving a low-cost implementation with little loss in compression efficiency. A heuristic search algorithm can be used to constructs the probability count table. For neural networks, the heuristic search algorithm can operate at the level of layers, however, other groupings are possible. The heuristic search algorithm takes a sample input and uses the distribution of values to break the input value range into several sub-ranges, each characterized by a starting value that corresponds to a symbol prefix plus an offset. For each sub-range, the encoder 102 assigns a probability count representing the approximate frequency by which the values within the sub-range appear in the input sample.

In some cases, for runtime produced values, such as activations, the encoder 103 can use profiling to construct the probability count table. In some cases, the system 100 does not know the probability counts for the activations because they are runtime calculated. Running a table construction algorithm can be prohibitively expensive and needs to be fixed before the network is executed. For profiling, the neural network can be run with a specific input (for example, a sample image) and all activations are recorded for this input. The probability count table is determined for this input and is used for subsequent runs. This profiling assumes that the probability counts determined for the sample image are a representative approximation of those encountered for any other input image because, while individual values change significantly with different input images, when viewed as a group, the distribution remains similar.

The system 100 can use efficient, generally low-cost, hardware encoders 102 and decoders 104 to seamlessly decode input values as they are read from off-chip memory and to encode output values as they are written to off-chip memory. While different groupings are possible, for clarity of illustration, the present disclosure assumes that processing proceeds layer by layer.

At block 210, the encoder 102 outputs the encoded symbols and offsets to memory storage, such as to the shared memory 140. At block 212, the decoder receives the encoded symbols and offsets from the shared memory, as a data stream to be decoded back into weights and/or activation related data; for example, back into the form of tensors.

At block 214, the probability count table contents are loaded into the decoders 104 from memory 106. At block 216, the decoders 104 use the probability count table to decode the inputted data. The inputted data is encoded into two streams, one for the symbols and another for the corresponding offset. In most cases, both streams are read in sequential order and each decoder 104 produces one value per step. In particular cases, to sustain bandwidth typically needed for machine learning workloads, a plurality of decoders 104 can operate in parallel. For this purpose, the input data stream can be partitioned into separate substreams, each of which is encoded and decoded independently. Each decoder 104 can time multiplex over multiple streams. Moreover, several such decoders 104 can operate in parallel. On the output of each layer, one or more encoders 102, each potentially time-multiplexed over several substreams, encode the values into symbol and offset streams prior to output (such as prior to writing to memory).

At block 218, the decoders 104 outputs the decoded data stream to the buffers of the processing units 150, or the processing units themselves, for use in execution of the machine learning networks.

The encoder 102 and the decoder 104 can, in some cases, use fixed-point logic and respective tables; for example, containing 16 rows of 10b and 11b values, respectively. These tables can be shared across multiple streams. In this example, encoding each stream requires memory units 106 of three 16b registers and two 8b registers for maintaining state. Decoding each stream requires memory units 106 of three 16b registers and one 8b register. The encoder and decoder can be pipelined, thus allowing the system 100 to time multiplex the encoder and the decoder while having to replicate only these state registers per stream. This allows the system 100 to use fewer encoders and decoders to meet typical workload needs. In addition, pipelining reduces the amount of work per stage, and thus per cycle, and can reduce latency constraints on the logic, which can enable even higher energy efficiency.

Advantageously, the system 100 can boost effective off-chip capacity and bandwidth without requiring any modifications to a neural network model. In this way, a neural network architect can deploy the present embodiments during design time to reduce the amount of off-chip memory and thus the cost needed to meet a desired performance target. Advantageously, the overall computing system needs to go off-chip less often, which rewards well established model optimizations such quantization and pruning without requiring it for all models. The system 100 may benefit from quantization approaches that reduce bit width and would generally reward further advancements to even shorter bit-widths. Particularly, the system 100 provides substantial benefit for any neural network approach that yields more biased value distributions.

As described herein, the present inventors conducted example experiments of the present embodiments, implementing a compressor and decompressor in Verilog and in a 65 nm tech node demonstrating its performance and energy efficiency. As evidenced, the system 100 was seen to reduce data footprint (weights and activation) to 45%, 30%, 69%, 83%, and 47% for BiLS™, pruned GoogleNet, MobileNet, NCF, and Q8BERT; as it adapts and compresses models using more aggressive quantization methods. For example, it reduces data footprint to 54% and 36% for quantized versions, respectively of Intel's INQ and IBM's PACT, of ResNet18. In the interest of clarity, the present disclosure assumes that the inputted values are 8b integers; however any suitable length of values, longer or shorter, can be used.

Figure 5:
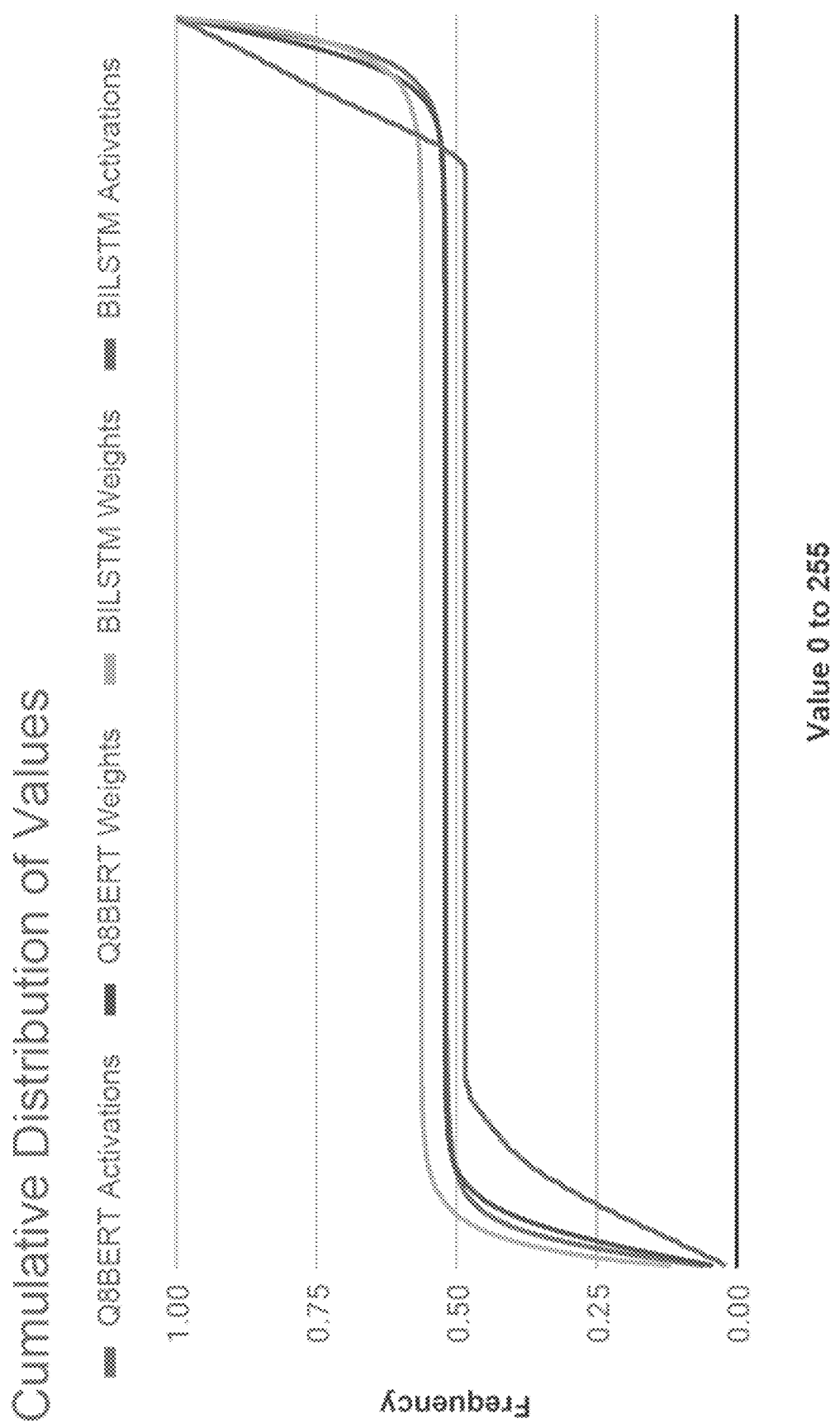
FIG. 5 is a chart showing an example cumulative distribution of frequency of occurrence for values of two layers of a machine learning network.

FIG. 5 illustrates an example cumulative distribution of frequency of occurrence for values of two layers. The first shown distribution is Layer 10 from Q8BERT and the second shown distribution is Layer 1 from BILS™. Distributions for activations and weights are shown separately. The distributions are far from uniform: Around half of the values tend to be close to zero, where another half or so tends to be close to 255. Conventional memory hierarchies do not capitalize on this property as they generally store all imap or fmap elements using a datawidth which is sufficiently long to accommodate any value possible. Some compression approaches take advantage of such distributions. For example, by storing prefixes of 0s (group near zero) and 1s (group near 255). However, as the value length is encoded explicitly, the values are first grouped and a common length is used for all values in the group. This reduces encoding efficiency for three reasons: (1) the bit length field is fixed overhead as it needs to specify any length from 1 to 8; (2) the bit length used per group is dictated by the value with the highest magnitude; and (3) a per group bit vector with one bit per value identifies those that are zero. Ideally, the system 100 would want to use as few bits as possible to encode the values. Arithmetic coding advantageously has the length of the encoded representation use scales according to the frequency of the respective value in the original stream. It can thus outperform other encoding approaches that rely on frequency, as it can assign even a fractional number of bits to each input value. This is not possible with other frequency-based approaches that use a bit string to represent each value and where the length of each string scales according to the frequency of the value.

There are various challenges and opportunities that exist for off-chip compression for deep learning workloads. Indexing is one such challenge because compression methods for general purpose systems generally must support random, fine-grain accesses. This requires the ability to locate the compressed values in memory both quickly and at a fine-grain granularity. This generally forces general-purpose compression approaches to use small containers. To support random accesses, some compression approaches reduce the amount of data transferred but not the size of the containers they use in storage. For example, they encode data within a cache line so that it needs to read or write fewer bits. However, the full cache line is still reserved. Thus, they only improve bandwidth but not effective capacity. Other approaches use a level of indirection to identify where data is currently located in memory; also boosting capacity. However, they have to carefully balance between flexible placement and metadata overhead. Some approaches use coarse grain containers when accessing off-chip; however, there is a significant price anytime the system does not access the full container.

Concurrency and payload are another challenge. Memory hierarchies for general-purpose systems need to support a few narrow processing cores, whereas deep learning generally favors massively data-parallel execution. To sustain performance, this needs a highly concurrent and wide payload memory hierarchy. When data is not compressed, this is easily achieved by using several wide on-chip memory banks. Individual data values can be laid out in those memories so that they align directly with the corresponding functional unit inputs obviating lateral data movement. However, once data is compressed, this alignment will generally be broken. As wire delay and energy are major considerations in various technology nodes, care must be taken to avoid data movement over long distances, where possible. To benefit from high compression, while avoiding expensive on-chip crossbars supporting lateral movement of wide data payloads, the system 100 can target off-chip memory compression where the cost of compression/decompression can be easily justified given the high cost of off-chip accesses. Advantageously, this allows the system 100 to use several, narrow decompressors/compressors. This is possible because: (1) machine learning workloads are generally latency tolerant as they massively data parallel, and (2) generally exhibit regular and mostly known in advance access patterns. Accordingly, it is possible to break the inputs and outputs into multiple sequential substreams, multiple of which can then can then be decoded and encoded in parallel to meeting the bandwidth requirements placed to the off-chip memory system by the workload.

Another challenge has to do with content: Generally, compression approaches for general purpose systems capitalize on value behaviors found in "typical" programs, such as full or partial value redundancy. For example, memory pointers tend to share prefixes (e.g., pointers to the stack or to heap allocated structures). Programs often use aggregate data structures which tend to exhibit partially repeated value patterns (e.g., flag fields). Compression approaches need to handle a variety of datatypes including integers and floating point numbers, or characters from a variety of character sets (e.g., UTF-16). Further, programs generally manage datatypes of various power-of-two datawidths, such as 8b, 16b, 32b or more. Finally, programmers often use the "default" integer or floating-point datatypes (32b or 64b today). Compression approaches need to handle and capitalize on these characteristics. The bulk of values in deep learning workloads are for fmaps and imaps which are large arrays of short fixed-point values; such as 8b with even 4b possible in some cases (there are models for which 16b is still necessary, e.g., for certain segmentation models where even small drops in accuracy translate in highly visible artifacts).

Embodiments of the system 100 makes use of arithmetic coding. Arithmetic coding converts an input sequence of symbols (or values) into a value between 0 and 1. This value uniquely identifies this particular sequence of input values, and thus, can be decoded to reproduce them. The encoded value's bit length depends not only on the sequence of values but also by their frequency.

As illustrated in ALGORITHM 1, provided below, Arithmetic Coding accepts a sequence S of input symbols $S = s_N \ldots s_i \ldots s_0$ from vocabulary V of symbols $\{v_s, \ldots, v_0\} \in V$ and a table of ranges [$phigh_j$, $plow_j$), one per symbol in V. It outputs a code value which is a fractional number in [0, 1) which uniquely represents the input sequence S. Internally, the coding uses two state variables high and low. Encoding starts by setting the current range boundaries to [0.0, 1.0) at line 1. Each symbol $s_i$ is read in line 3, and it is used to index the table of ranges in line 4. Line 5 calculates the current range length range. The new boundaries are offset from the current low boundary by adding the scaled with range symbol boundaries.

Algorithm 1: Basic Arithmetic Coding: Infinite Precision.
Data: $S = s_N, \ldots, s_0$, $phigh_s, \ldots, phigh_0$, $plow_s, \ldots, plow_0$
Result: code encoding the input sequence S
[1] low=0.0; high=1.0;
[2] while i<N do
[3] $s = s_i$
[4] probh=$phigh_{s_j}$; probl=$plow_{s_j}$
[5] range=high−low
[6] high=low+probh×range; low=low+probl×range
[7] i++
[8] end
[9] code←low For the purposes of illustration, consider an example where four values A through D are encoded, with probabilities of occurrence of 0.4, 0.1, 0.3, 0.2, respectively. Arithmetic coding could include assigning the range [0, 0.4) to A, the range [0.4, 0.5) to B, and [0.5, 0.8) and [0.8, 1.0) respectively to C and D. This way the single value A can be represented by any number in the [0, 0.4) range, while B can be represented by any value in the range [0.4, 0.5). This seems inefficient, but this is the case only because they involve single values. Consider instead the following sequence: ABA. Arithmetic coding progresses by maintaining a range [low, high) which initially is [0.0, 1.0). It first encodes A. This restricts the range to [0.0, 0.4). To encode B, it further restricts the range to indicate that it encountered a B. This is performed by adjusting the high and low marks so that they represent the sub-range [0.4, 0.5) of the current range of [0.0, 0.4). The new range becomes [0.16, 0.20). Any value within this range can be used to represent the string AB. To encode the next A, the coder must now further restrict the current range so its subrange corresponds to A's [0.0, 0.4). Thus, the range becomes [0.16, 0.176). Notice that prior to A, the range had a width of 0.04=0.20−0.16 and that the high mark for A is 0.4, making the new high mark 0.20+0.04×0.4 off the new low (which stays at 0.16 as A is assigned the range starting at 0). Encoding the final B requires further restricting the existing range to its [0.8, 1.0) sub-range, or to [0.2002, 0.2025). Any value within this range can be used to represent the encoded sequence of ABAC. This approach, while effective, has features that are undesirable for hardware implementation: (1) It requires infinite precision arithmetic; and (2) it uses a range table with one entry per potential input value. Thus, it is generally unacceptably expensive for the present purposes.

Approximations of infinite precision arithmetic may be possible; however, they are expensive and they would require execution time that can be proportional to the current precision. As expected from encoding/decoding tensors of several thousands of elements, even if the implementation cost was not prohibitive, the execution time and energy would render this approach not practical. The system 100 advantageously makes use of an implementation of arithmetic encoding that uses finite precision. In an embodiment, the system 100 implements a single step encoding/decoding where all updates to the state (high, low, and code) are performed in a single step and where arithmetic coding is used only for a variable portion of the input stream by using the probability count to determine which prefix to encode. The bit length of this prefix generally varies depending on the value's expected appearance frequency. For example, using 16b wide high, low and code registers and 10b range boundary table values.

Using a table with one entry per potential input value would be prohibitively expensive energy-wise and area-wise. In most cases, the encoder 102 and the decoder 104 process one symbol (values) per step, so it is desirable to keep area and energy costs to a minimum so that the units can be replicated to achieve high bandwidth data supply. For 8b models, it would need to have at least one table of 256×10b×2 5 Kb of storage just for the boundary table. Even if the area was not a concern, the energy required to access such a table would reduce and possibly eliminate any benefit obtained from reducing the data stream to off-chip. Instead of assigning a table entry per symbol, embodiments of the system 100 can instead use a limited number of entries.

The encoder 102 partitions the input value space into several non-overlapping ranges; for example, into 16 ranges. Each range is defined by its minimum value, $v_{min}$, its maximum value $v_{max}$, and offset length OL in bits. Every value v within the range is encoded as (symbol, offset) where symbol=$v_{min}$ and offset=v−symbol; which is an unsigned integer of OL bits. Additionally, $v_{min}$ is always of the form x . . . x0 . . . 0, that is it a bit prefix of all values with the range. For an example implementation targeting 8b or shorter values, the system 100 uses 16 ranges, with 8b $v_{min}$ and $v_{max}$, and 3b OL. In an implementation using 16b values, 16 ranges can be used, and extending $R_{min}$ and OL to 16b and 4b respectively.

The encoder 102 accepts an input sequence of values and compresses it into two sequences. The encoder 102 processes each value one by one. It splits the value into a (symbol, offset) pair according to the range it maps to. The encoder 102 then arithmetically encodes just the symbol ($v_{min}$) while storing the offset verbatim, in most cases, using only as many bits as necessary. The encoded symbols comprise a first output stream, and the corresponding offset comprises a second output stream. Encoding is completed when the last symbol is encoded. Along with the two encoded streams, the encoder 102 can also store metadata, for example, containing: (1) the number of symbols encoded (this can be used to terminate decoding); and (2) a range table and a probability table used in arithmetic coding.

To perform arithmetic coding, each value range is also assigned a probability count range (low$_i$, high$_i$). In an example implementation, 10b probability counts are used, where the full range of (0x0, 0x3 f f) is assigned across the symbols. As described herein, a heuristic algorithm can be used to determine value ranges that reduce the overall footprint, comprising the encoded symbol and offset streams.

TABLE 1 shows an example probability count table as used for weights of a layer of BILS™. The fields "IDX" and 'p' respectively report the row index and the symbol prob-ability and are shown for clarity. They do not need to be stored. Row 0 captures the four values in the range [0x00, 0x03] and associates all with the probability count range of [0x000, 0x1EB). Given that max probability count is 210−1=0x3FF, this corresponds to a probability 'p' of 0.4795. Any value in this range will be mapped to symbol 0 which during decoding will be mapped back to $v_{min}$=0x00. To recover the original number, an OL=2b will be recorded such that v=$v_{min}$+offset. Rows 3 through 12 are all assigned to a zero length probability count range ([0x23A, 0x23A) where low=high). These are values that do not appear at all in the input weight tensor. Since weights are statically known, this is permissible. Row 13 captures all values in the range of [0xD0, 0xF3] which will be mapped to symbol 13. Notice that the offset requires 6 bits since 0xF0−0xD0=0x23. Since 0x23<26−1, this means that not all offset values will be used for this range. No special processing is needed to ensure that this is so. If the table is implemented using all fields shown, then entries with 0 probability can be omitted, and the order of rows can be changed at will. For example, if searching through the table is pipelined at the row level, rows can be ordered according to their respectively probability ('p' column). This will allow the system 100 to power gate any stages/rows following the one that matches. In some cases, it can be assumed that the symbols are ordered such as that $V_{min}[i]=V_{max}[i-1]+1$ for i>0, so that it needs to store only one of the two per row. Similarly, only the high count per row needs to be stored.

TABLE 1

| IDX | V_min | V_max | OL | Low   | High  | P      |
|-----|-------|-------|----|-------|-------|--------|
| 0   | 0x00  | 0x03  | 2  | 0x000 | 0x1EB | 0.4795 |
| 1   | 0x04  | 0x07  | 2  | 0x1EB | 0x229 | 0.0605 |
| 2   | 0x08  | 0x0F  | 3  | 0x229 | 0x238 | 0.0146 |
| 3   | 0x10  | 0x3F  | 6  | 0x238 | 0x23A | 0.0020 |
| 4   | 0x40  | 0x4F  | 4  | 0x23A | 0x23A | 0.0000 |
| 5   | 0x50  | 0x5F  | 4  | 0x23A | 0x23A | 0.0000 |
| 6   | 0x60  | 0x6F  | 4  | 0x23A | 0x23A | 0.0000 |
| 7   | 0x70  | 0x7F  | 4  | 0x23A | 0x23A | 0.0000 |
| 8   | 0x80  | 0x8F  | 4  | 0x23A | 0x23A | 0.0000 |
| 9   | 0x90  | 0x9F  | 4  | 0x23A | 0x23A | 0.0000 |
| 10  | 0xA0  | 0xAF  | 4  | 0x23A | 0x23A | 0.0000 |
| 11  | 0xB0  | 0xBF  | 4  | 0x23A | 0x23A | 0.0000 |
| 12  | 0xC0  | 0xCF  | 4  | 0x23A | 0x23A | 0.0000 |
| 13  | 0xD0  | 0xF3  | 6  | 0x23A | 0x23C | 0.0020 |
| 14  | 0xF4  | 0xFB  | 3  | 0x23C | 0x276 | 0.0566 |
| 15  | 0xFC  | 0xFF  | 2  | 0x276 | 0x3FF | 0.3838 |

On the above approach, the incoming value can be compared against entries/rows in the hardware tables, that have explicit low and high range values, to find the table entry/row whose range (as defined by low and high) contains the value. With this arrangement, generally there is no constraint on how to order the rows as long as each row is unique and non-overlapping with other rows. In this way, ranges of the rows can be stored in the table and in any order. If other cases, if the entries are stored in ascending order, where the low mark of a row is the high+1 mark of the immediately preceding row, the system generally does not need to store either low or high values because they are implied. However, in such cases, there can generally be no gaps in the ranges.

The decoder 104 accepts two sequences as input, one containing the compressed symbols and the other the corresponding offsets. The decoder 104 produces, at the output, the corresponding original values. To do so, it uses arithmetic decoding for the symbol sequence to obtain a value prefix that corresponds to a next symbol. Using the symbol table, the decoder 104 then extracts an appropriate number of offset bits, which it adds to the value prefix. The process continues until all symbols have been decoded. The decoder 104 produces a single value per step. Using pipelining and replication, the system 100 can achieve the desired bandwidth target. In a particular case, using the High and Low values and set of bits received from the symbol stream, the Low and High fields of the probability count table are used to determine which symbol is represented by each set of bits from the symbol stream. The symbol represents an index into the table, which provides $V_{min}$ and OL (the number of offset bits). The original value can then be recovered by adding (or ORing) the offset bits to $V_{min}$.

Figure 6:
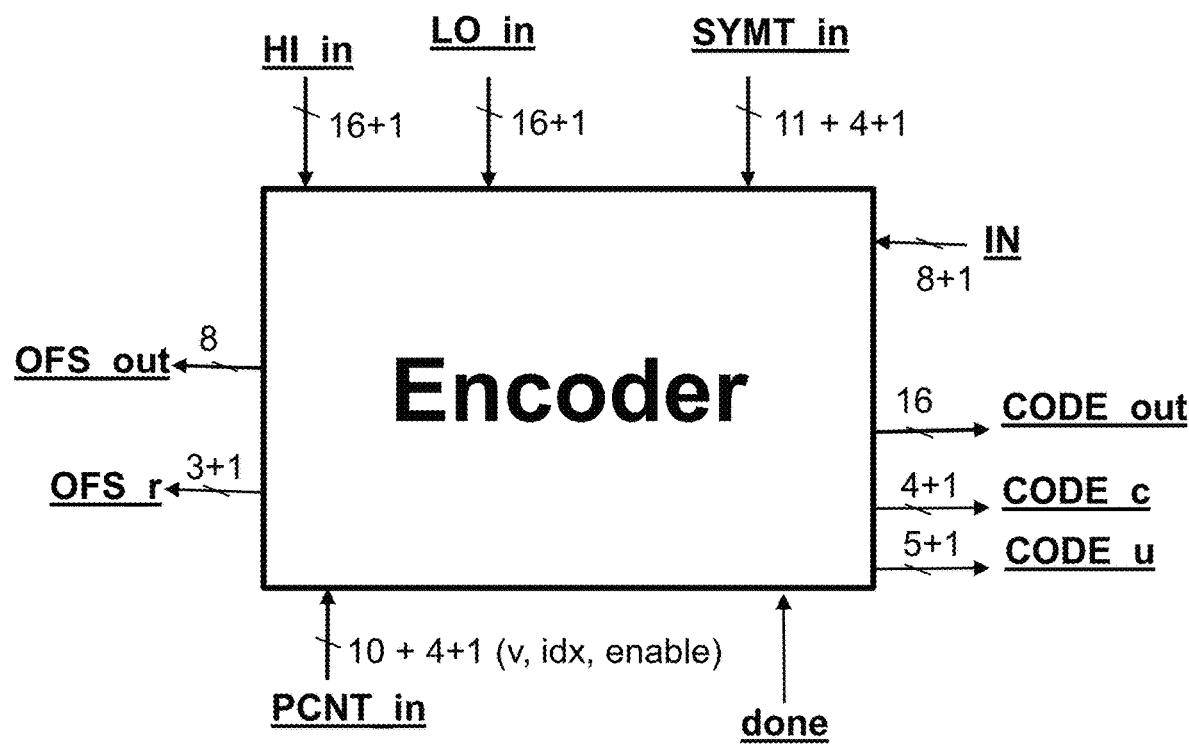
FIG. 6 shows a block diagram for an interface to an example implementation of an encoder in accordance with the system of FIG. 1.

FIG. 6 shows an interface to an example implementation of the encoder 102. The following ports can be used for initialization:

HI in and LO in are used to initialize the decoder range which is stored in two internal registers each of 16b. An enable signal indicates that the value should be loaded into the corresponding register. FIG. 6 denotes these ports with 16+1 meaning, that they contain a 16b data value, plus a 1b enable signal. Alternatively, the registers can be given an initialization signal that forces them to 0xFFFF and 0x0000 respectively.

SYMT in is used to initialize the value ranges and offset fields of the symbol table. The implementation assumes that the full range is mapped, that the rows are ordered in value order, and that each range starts immediately after the previous one ends. Accordingly, this write port includes 8b+3b=11b for $R_{max}$ and the OL for one row, the 4b index to the target row, and an 1b enable.

PCTN in is used to initialize the probability count entries. It is ordered to match the symbol table. The port uses 10b for the probability count (one per row), a 4b row index, and a 1b enable.

The 8b IN port along with its 1b enable are used to send the input value that needs to be decoded in this step (if any —enable).

The 1b done signal indicates that there are no more values to be encoded.

In some cases, SYM in and PCNT in can be combined into a single port sharing the enable and index portions.

In the above example implementation, in every step, the encoder 102 receives a value to encode via the IN port. The port carries an 8b value plus a 1b enable. This can be used to support cases where there is presently no value to encode; for example, the value may be coming from a processing element that has yet to produce it. In the above example implementation, the encoder processes the symbol internally and produces the following outputs:

OFS out and 8b value containing the corresponding offset. The offset appears in the least significant bits. The length of the offset is given by the 3b OFS r. An additional 1b signal in OFS r indicates whether an offset is produced in this step.

A 16b CODE out contains a number of bits that are to be written into the encoded symbol stream. The bits are to be taken from the most significant bits of this output. The number of bits that are to be taken is given by the 4b CODE c which also includes an additional 1b enable signal indicating whether there are any bits at all. The 5b OUT u along with its 1b enable indicate whether we should (enable) include additional bits in the output and how many (count is the 5b portion) those are. The bits are to be inserted between the most significant bit of CODE out, and they take the inverse value of that bit. For example, if CODE OUT is 0xF0000, where it uses 4b, and CODE u's enable is zero, then 0xF should be written into the encoded stream. If, however, the CODE u enable was one, and the CODE u 5b indicates that two bits should be used, then, the encoded stream should be written with 0x27 (insert two 0s after the MSb 1 of CODE out and output 6b in total).

Figure 7:
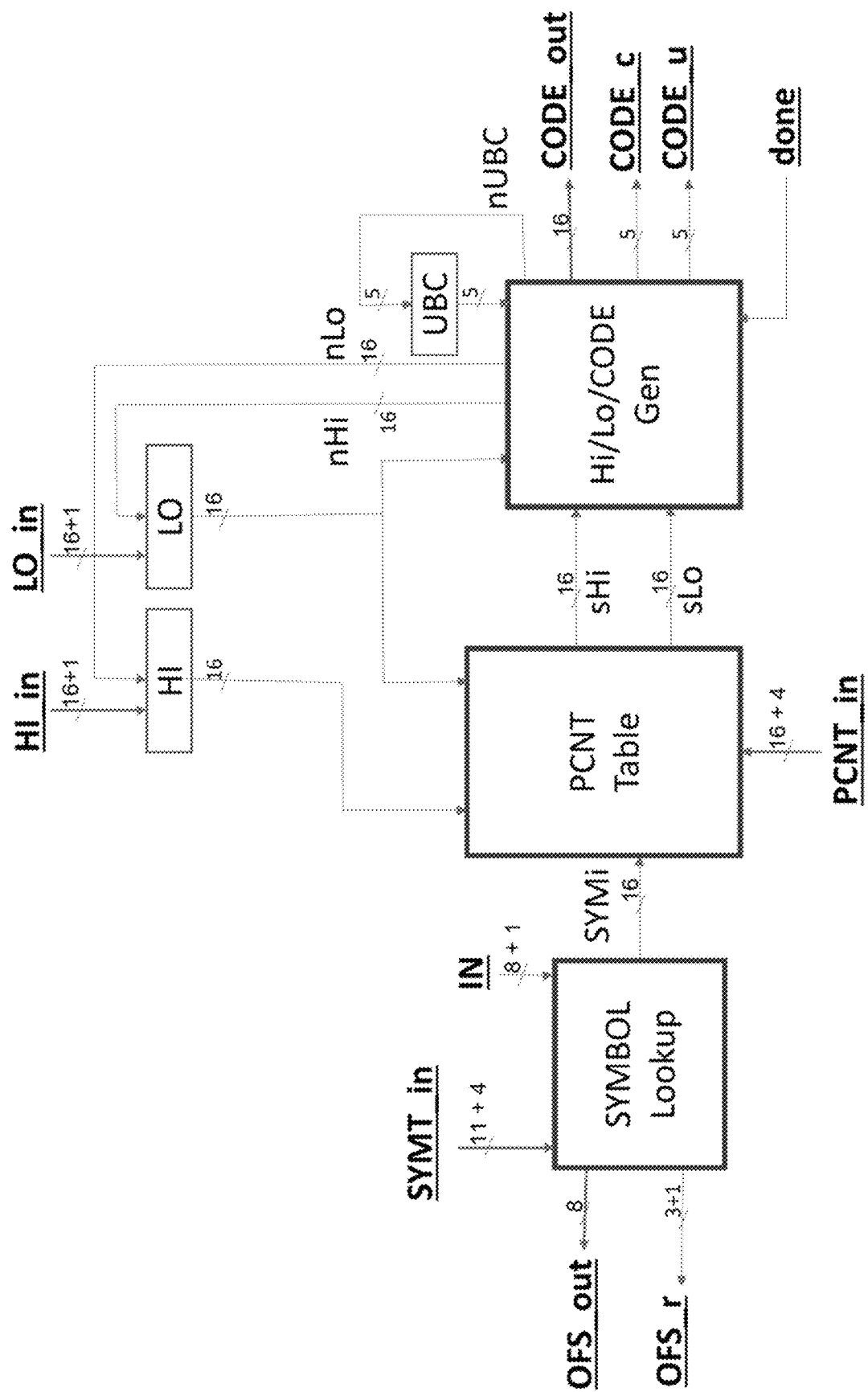
FIG. 7 shows a block diagram for an example implementation of an internal organization of the encoder in accordance with the system of FIG. 1.

FIG. 7 shows an example implementation of an internal organization of the encoder 102. In this example, there are three blocks: "SYMBOL Lookup", "PCNT Table", and "Hi/Lo/CODE Gen". Two 16b registers HI and LO maintain the current range. These are initialized to 0xFFFF and 0x0000 respectively. Encoding the input value IN starts in the "SYMBOL Lookup" block, which identifies the symbol this value maps to. This block produces two outputs: the first is the output to the offset stream comprising ports OUT_out and OFS_r as previously described. The second output is SYMi, a 1-HOT encoded 16b vector indicating the table row (symbol index) and the value mapped to SYMi is fed into the "PCNT Table" block; which identifies which probability count range this symbol maps to. The output from the "PCNT Table" block is then used by the "Hi/Lo/CODE Gen" block to update the current code range, and to produce any encode stream output bits. A 5b UBC register counts the number of underflow bits. Its value is fed into the block and is updated by the unit using the UBCn signal.

Figure 8:
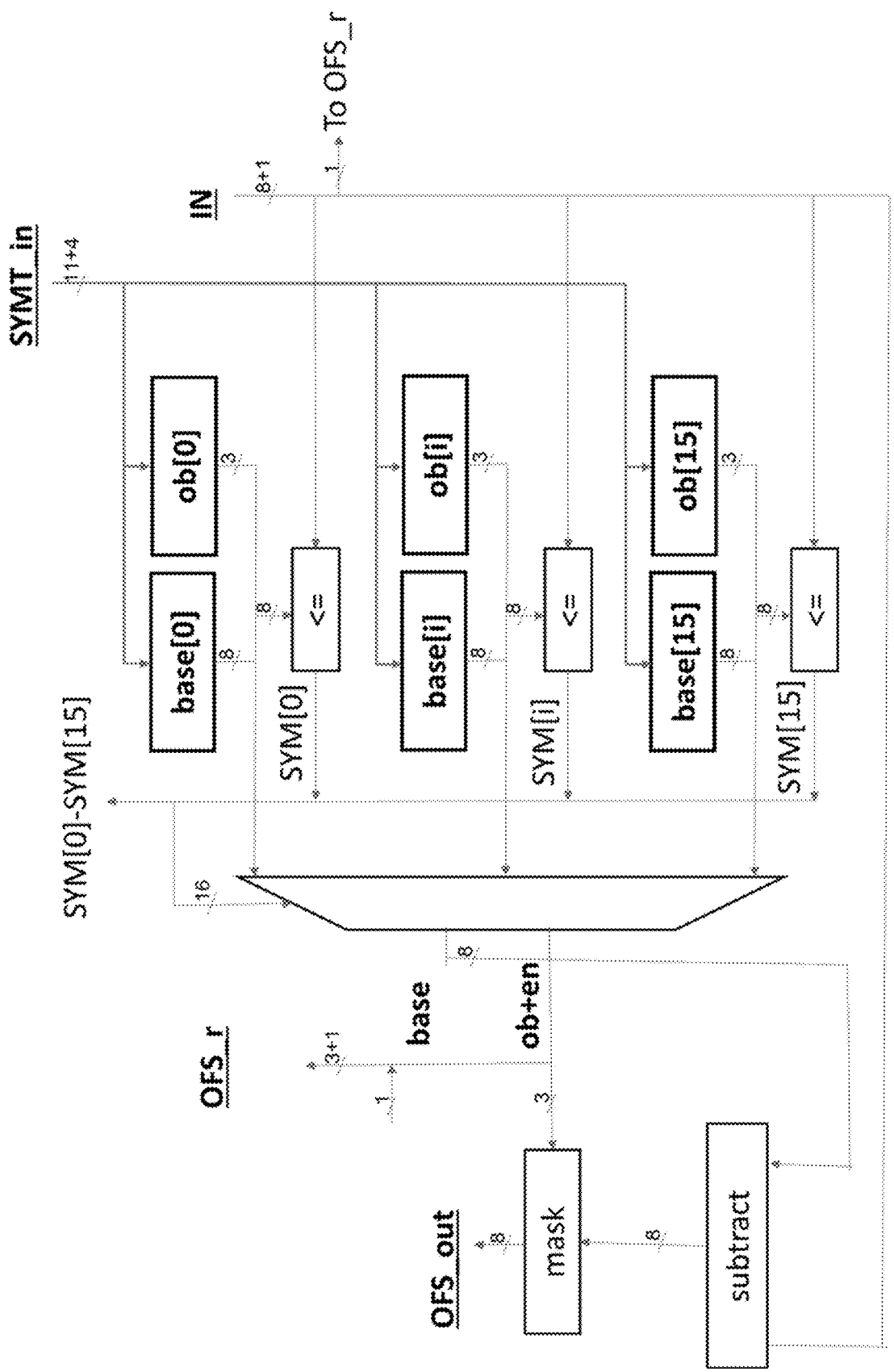
FIG. 8 shows a block diagram for an example structure of a SYMBOL Lookup block in accordance with the system of FIG. 1.

FIG. 8 shows the structure of the "SYMBOL Lookup" block. The 8b IN value is compared against the maximum value (base[i]=$R_{max}$−1) of all ranges using one comparator per row. Since the rows are ordered with the smaller base values appearing first, the matching row is the last one in order where the base is larger than the input value. This is used to generate the SYMi vector. The SYMi vector is then used to route the corresponding base and offset length field (ob in the diagram) to the components that generate the output offset. The offset is calculated as the difference between the 8b IN value and the matching base value and is trimmed via the "mask" block to ob bits.

Figure 9:
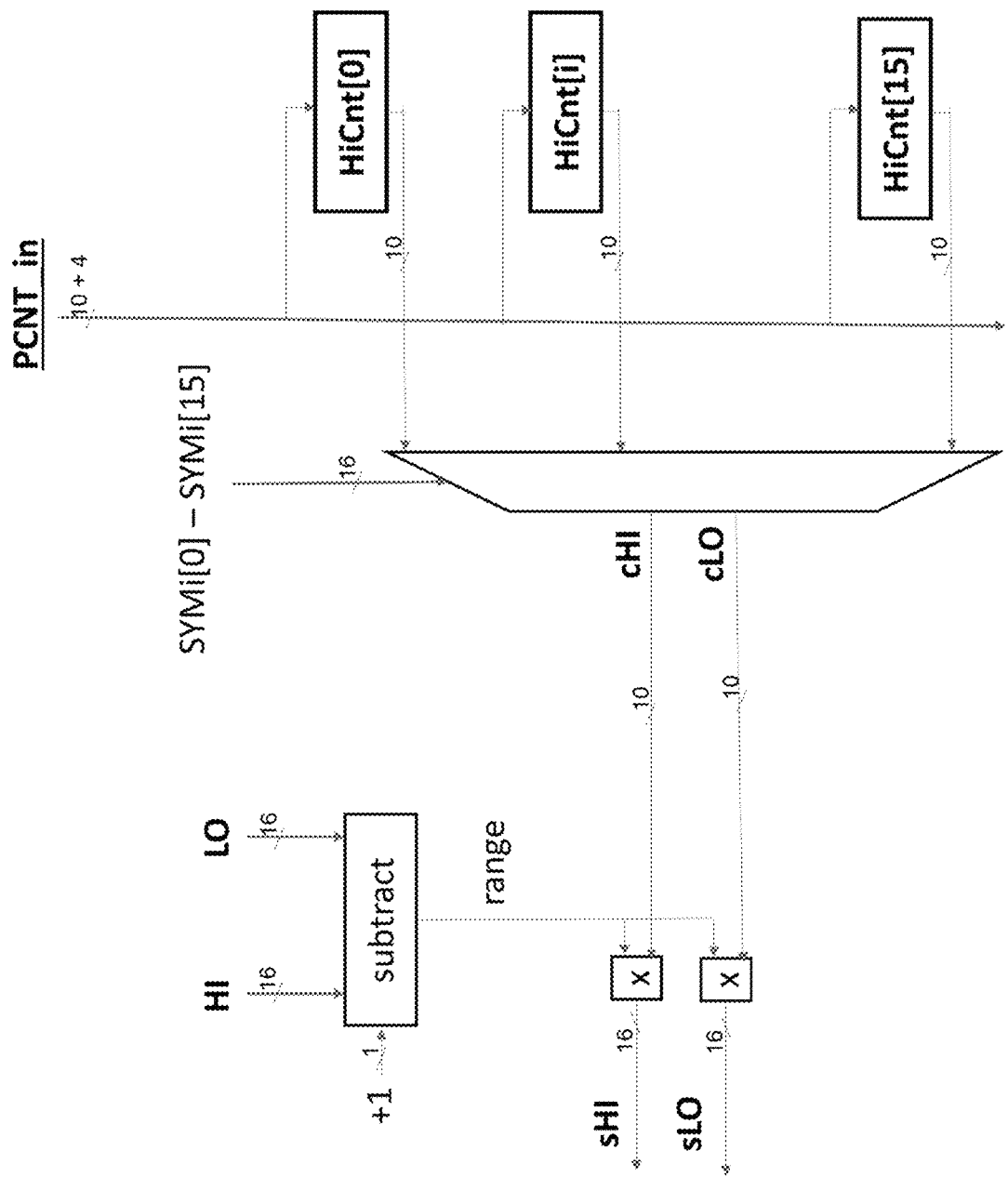
FIG. 9 shows a block diagram for an example structure of a PCNT Table block in accordance with the system of FIG. 1.

FIG. 9 illustrates an example of the PCNT Table block. The SYMi signals are used to select the boundary counts cHI and cLO for the range corresponding to the current symbol. For each symbol index, the unit holds a 10b probability count that represents the maximum for the range (inclusive). The cHI is the value of this register, and the cLO is that of the register for the preceding row or 0 if this is row 0. The cHI and cLO values need to be scaled according to the current range. The current range is given by range=(HI−LO+1) where HI and LO the 16b registers holding the current range. Scaling is performed by multiplying the range with the cHI and cLO. Since range is a 16b number and cHI and cLO are 10b numbers the multiplication produces a 26b number. Since a max probability count is $2^{10}-1$, the 10 least significant bits can be discarded as this amounts to dividing with the max probability count (generally a necessary step in arithmetic coding as it converts the counts into probabilities). Accordingly, the multipliers can omit any parts that serve to produce only any of those 10 least significant bits. The resulting scaled 16b range boundaries, sHI and sLO, are then fed into the "HI/LO/CODE Gen" block.

Figure 10:
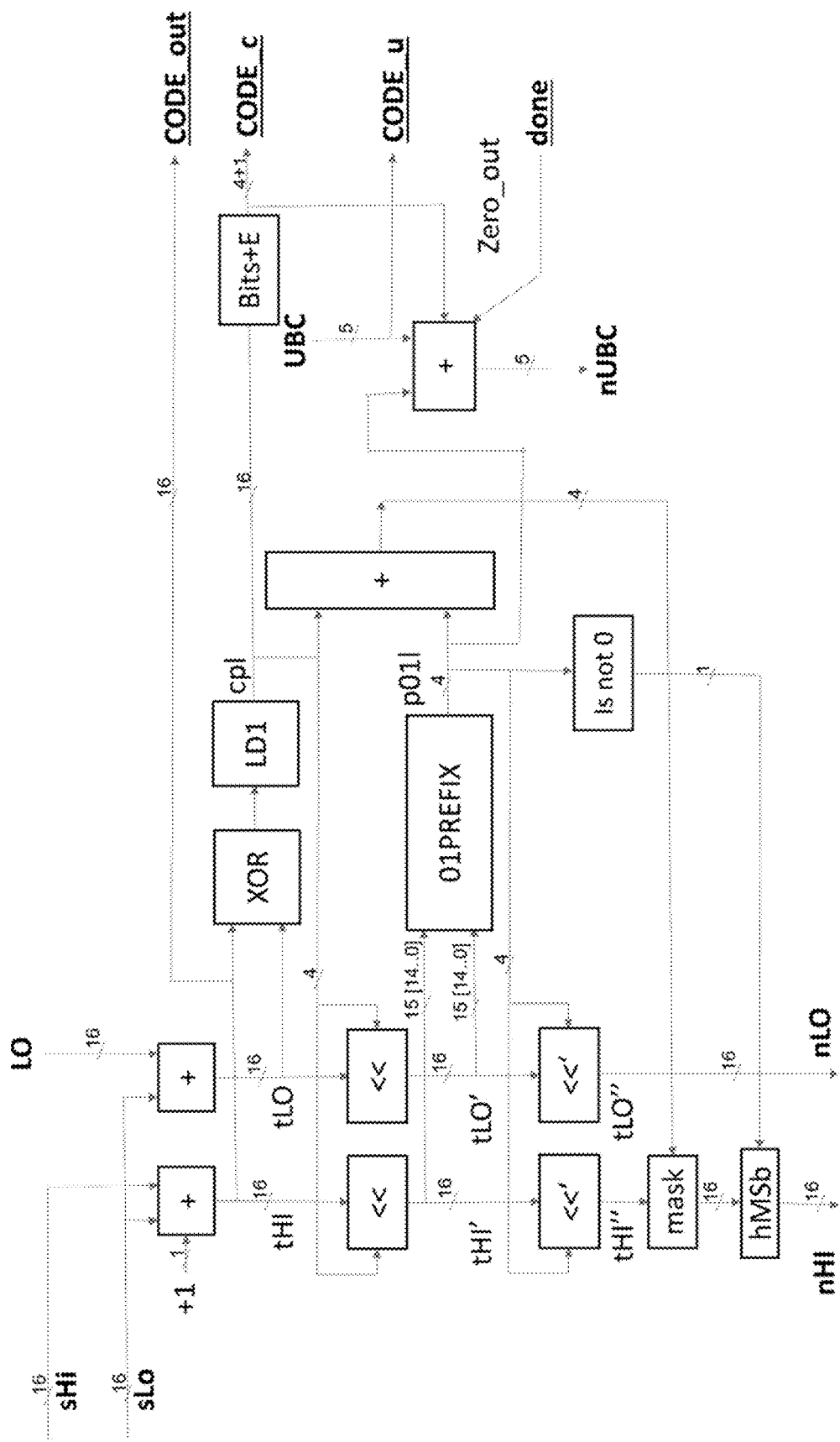
FIG. 10 shows a block diagram for an example structure of a Hi/Lo/Code Generation block in accordance with the system of FIG. 1.

The Hi/Lo/Code Generation block, an example of which is shown in FIG. 10, starts by calculating the new scaled range tHI and tLO given the new value. The sHI and sLO signals are used to calculate the tHI and tLO values by adding to each of the current LO. The sHI and sLO values correspond to an appropriately scaled range, however, one that is offset starting from 0. Adjusting this offset to LO places this range in the appropriate position given all the symbols seen thus far. The two 16b adders perform the necessary additions. For the high boundary, 1 is added as this is inclusive at this point. The rest of the unit performs two functions in order: (1) determines if tHI and tLO have a common prefix which can be output; and (2) detects whether tHI and tLO are in danger of underflow. For common prefix detection, the XOR block can produce a bit vector that identifies any bit positions that are different between tHI and tLO. The LD1 block then detects in the leading position if there is a difference, and thus identifies the length if any of a common prefix. Those bits can be written into an encoded symbol stream and they can be shifted out as they can no longer change. This results in updated tHI' and tLO'.

For underflow detection and handling, the encoder 102 uses finite precision arithmetic using arbitrary precision arithmetic. This is possible by effectively maintaining a window of 16b into boundaries of arbitrary bit length. The HI and LO registers contain these 16b windows. In reality, the boundaries can be the value of HI plus a suffix of an "infinite" number of 1s, and the value of LO plus a suffix of an infinite number of 0s. The 16b window is allowed to slide to less significant bits by shifting out any prefix bits that are certain to no longer change. To understand why this works, observe that as arithmetic coding encodes one symbol after the other, the HI and LO boundaries shrink. HI always becomes smaller, while LO always grows larger. However, it should always be the case that HI>LO since each symbol encoded has a non-zero probability assigned to it. HI and LO will grow an increasingly longer common prefix (most significant bits that will no longer change). Those are the bits that the encoder can safely "discard" by shifting them out of the HI and LO register, while writing them on the encoded stream.

However, there are cases where depending on the probability range of a new symbol and the current range, having a window of just 16b is not enough to appropriately scale the range so that HI remains larger than LO. This case is where HI contains a value of the form 100 and low a value of the form 011. This corresponds to the case where HI and LO are converging around 0.5 and where there may eventually end up being both above 0.5 or below it, and thus, may require being able to perform arithmetic with more than 16b. This happens when the range adjustments done by the incoming symbol are significantly smaller so that they cannot effect any of the 16 bits in the current window (they need to affect even less significant bits); which can be referred to as underflow bits. The encoder 102 handles those bits by entering a state where it records how many underflow bits are needed allowing the window to slide. Eventually, when another prefix is found, the encoder 102 can determine whether the range converged above 0.5 or below, and insert those at the output stream.

Accordingly, the encoder 102 handles the underflow bits by identifying any prefix of tHI' and tLO' and starting from the second most significant bit, where tLO is all 0s and tHI is all 1s. This subprefix is shifted away from tHI' and tLO'. The result are updated tHI" and tLO". To detect the length of this subprefix, the encoder 102 uses a leading 1 detector for tHI' (ignoring the MSb) and a leading 0 for tLO' (again ignoring the MSb). The subprefix is the most significant position among the two. This is implemented in the 01PREFIX block. Internally, this block uses a 2-input AND gate per bit position, with one input directly connected to tLO' and the other connected after inversion (NOT) to tHI'. The output of those 15 AND gets drive a leading 0 detector. The leading 0 position is where the subprefix, if any, ends. This subprefix is removed from tLO' and tHI' producing tLO" and tHI". The length of this subprefix is added to the UBC register which counts the number of underflow bits detected thus far.

For final HI and LO generation, after the common prefix and the underflow subprefix have been discarded, the encoder 102 adjusts the final HI and LO values. The encoder 102 inserts a suffix of 1s in HI to make up for the fact that it shifted out several MSbs. Recall that HI is meant to slide over a number that as a suffix of infinite 1s. In addition, the encoder 102 sets the MSb of HI to 1 if underflow bit mode was entered. The final output is the nHI and nLO values, which are loaded into the HI and LO registers respectively.

Other ways of avoiding underflow in the HI and LO registers is possible. For example, the range may be expanded anytime it drops below half the maximum range.

Figure 11:
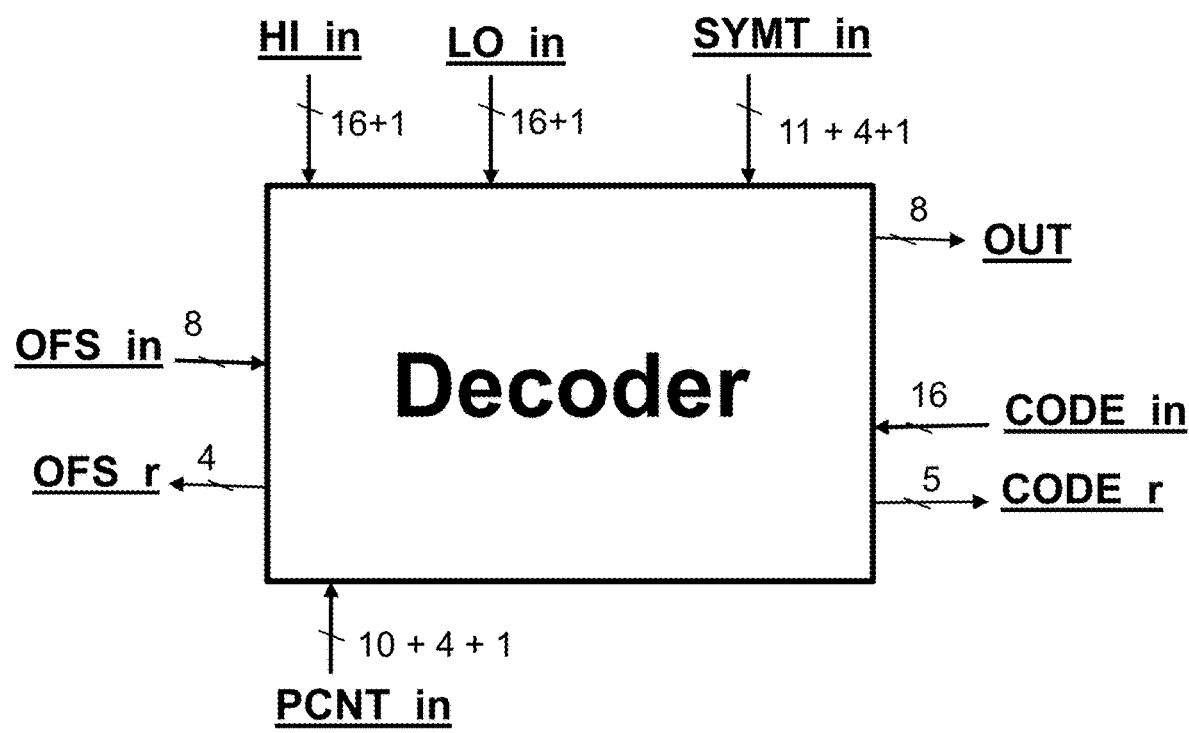
FIG. 11 shows a block diagram for an interface to an example implementation of a decoder in accordance with the system of FIG. 1.

FIG. 11 shows an interface to an example implementation of the decoder 104. In this example, the decoder 104 has the same initialization ports as the encoder 102 (instead of a "SYMBOL Lookup" unit the decoder has a "SYMBOL Gen" unit, however, internally these two units have the same symbol table). During decoding, it accepts two input streams, CODE IN and OFS in, for reading bits from the encoded symbol and the offset streams respectively. The ports operate as follows:

CODE IN is a 16b input where the decoder expects to receive the encoded symbol stream. At each step/cycle, the decoder reads in a number of bits and notifies whichever unit supplies them of their number via the 5b CODE r output signal; which specifies a 4b count plus a 1b enable signal indicating whether any bits were requested or not. The encoder 102 expects the bits to be read from the most significant bits of CODE in.

OFS in is similar to the 8b input that the decoder 104 uses to read in offset bits. How many bits are used depends on the output OFS r which is 3b plus a 1b enable. The offset bits are read from the most significant bit position of the OFS in.

Figure 12:
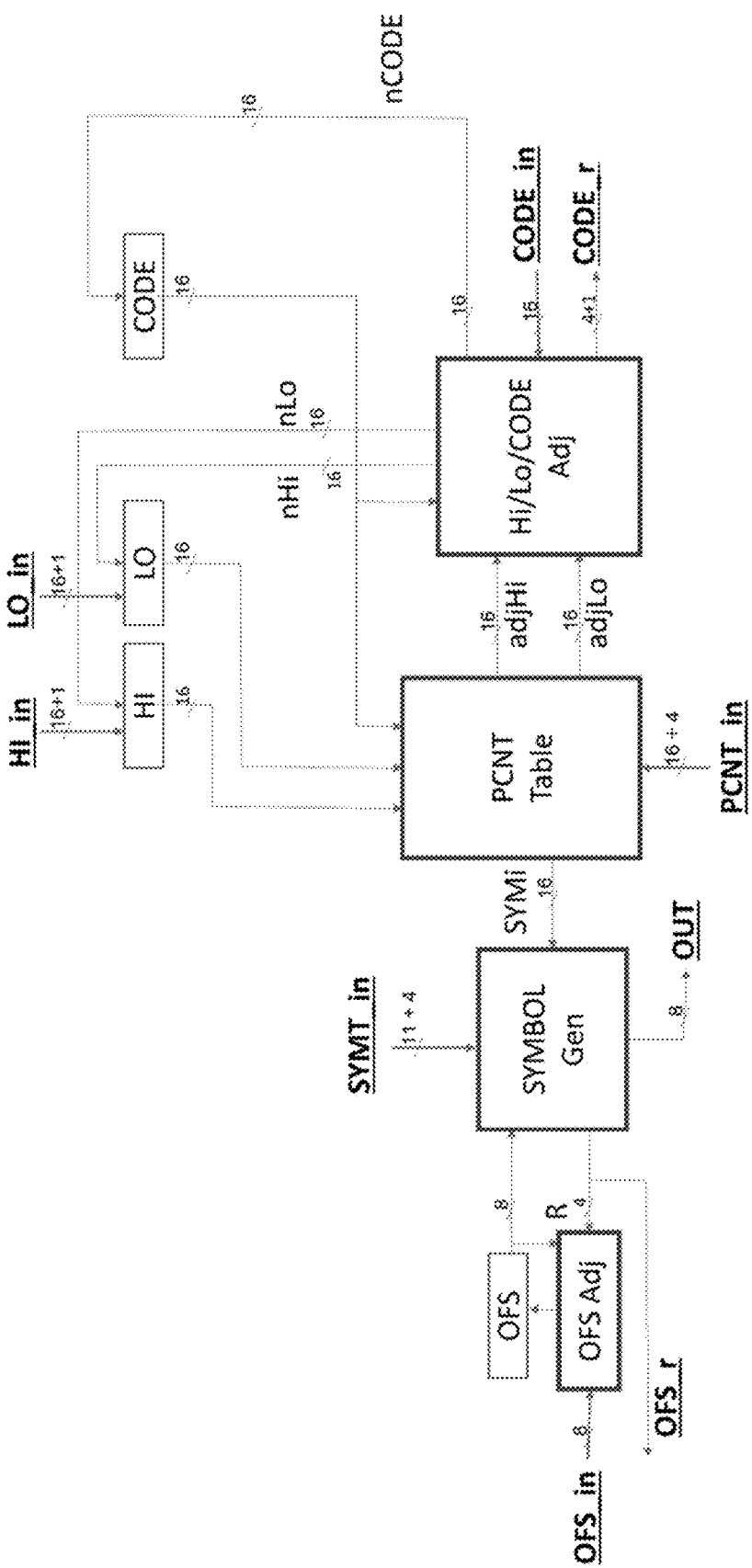
FIG. 12 shows a block diagram for an example implementation of an internal organization of the decoder in accordance with the system of FIG. 1.

FIG. 12 shows an example internal organization of the decoder 104. In this example, there are four blocks: "SYMBOL Gen", "PCNT Table", "Hi/Lo/CODE Adj", and "OFS Adj". Two 16b registers HI and LO maintain the current range. These are initialized to 0xFFFF and 0x0000 respectively. The 16b CODE register reads in the encoded symbol stream, and the 8b OFS register is used to read in the offset stream. In this example, decoding a symbol occurs by processing the current range boundary values HI and LO in "PCNT Table". The results in identifying a symbol row index in SYMi and two adjusted range boundary values adjHI and adjLO. SYMi; which are used by the "SYMBOL Gen" block to produce the original value in the processing consuming the corresponding offset from the offset stream. The decoded value appears on the OUT port. The "HI/LO/CODE" block produces the new range boundary values, nHI and nLO, adjusts the CODE value, and potentially consumes bits from the encoded symbol stream.

For the PCNT table unit, the goal is to determine which symbol range the current CODE value lies within. The unit first adjusts the CODE value so that it is offset starting at 0. This can be performed via a subtractor that calculates CODEadj=(CODE−LO+1); thus, removing the current low boundary from the CODE. Before the unit can determine which range this value falls within, it needs to scale the probabilities according to the current range width. Accordingly, a subtractor is tasked with calculating the current range length as range=(HI−LO+1). The probability counts defining the high boundary of each row are multiplied with range. This is a 10b×16b multiplication from which only the upper 16b are needed as this normalizes the value to the total probability count of 2¹⁰−1. The index for the first row, for which CODEadj is not less than or equal to the adjusted counts, corresponds to the symbol that needs to be decoded. The PCNT table unit produces two sets of outputs: (1) the first contains the adjusted range boundaries adjHI and adjLO; and (2) the second is a 1-HOT encoded vector SYMi identifying the row index. The adjHI and adjLO are fed to the "HI/LO/CODE Adj" block, whereas the SYMi output is fed to the "SYMBOL Gen" block.

The SYMBOL Gen block produces the decoded value. Using the SYMi, it accesses the symbol table and obtains the $v_{min}$ plus the ob field identifying how many bits the offset is. It uses the ob field to extract those bits from the OFS register. These bits are shifted out while additional bits are shifted in from the external offset stream using the OFS in read port. The final value is determined as the sum of $v_{min}$ plus the offset zero extended to 8b.

The HI/LO/CODE Adj block is tasked with adjusting the range boundary registers HI and LO and with consuming bits from the encoded symbol stream. Processing starts by first adjusting the adjHI and adjLO range boundaries to be offset based on the current LO boundary. Two 16b adders perform this adjustment and produce tHI=(adjHI+LO+1) and tLO=(adjLO+LO). The XOR and LD1 blocks identify any common prefix bits between tHI and tLO, those are discarded (shifted out) producing tHI' and tLO'. The length of this prefix is given by the cpl signal. The 01PREFIX block looks for the longest prefix (ignoring the MSb) containing just 0 bits and 1 bits respectively in tHI' and tLO'. If such a prefix exists, the range is in danger of being too small and it needs to be adjusted. The length of this subprefix is given by p01I. The LD1 and LD0 blocks can be combined and implemented via an AND gate per bit position (one input connected to tLO and the other to tHI after an inversion/NOT) followed by a leading 0 detector. Those bits are discarded producing tHI" and tLO". The mask block inserts 1lI+p01I bits into tHI" starting from the LSb (recall HI is supposed to be a value that has a suffice of an "infinite" number of 1s). Since cpI+p01I bits were shifted out from HI and LO, this many need to be shifted out from CODE and this many bits need to be shifted into CODE from the external encoded symbol stream. This is performed using the shift block that communicates with the external source via the CODE r and CODE in port. The hMSb block sets the MSb of the final nHI if the adjusted range becomes too small. In this case, the final CODE, CODEn, has to be inverted and this is performed by the cMSb block.

In some cases, processing neural networks places can provide significant bandwidth demands on memory. While some embodiments described herein can be used to process a single value per cycle, to meet the bandwidth demands of heavy workloads, it may be necessary to process multiple values per unit of time. The following provides two example approaches that can be used for processing multiple values: pipelining and replication.

In some cases, encoding and decoding can be pipelined to increase operating frequency, and to decrease the number of units needed to achieve a desired throughput; hence, improving area costs and energy efficiency. At block 204, the preprocessing module 108 can partition the input tensor into a number of subtensors, each of which can be encoded and decoded as independent streams. Some state elements of the encoder and decoder unit can be replicated to support the pipelined processing of multiple such streams. In some cases, all the streams can use the same probability count table; however, generally, replicating the PCNT (HiCnt[i]) and the symbol generation and lookup tables (base[i] and ob[i] fields) is not necessary. However, a separate set of the OFS, CODE, HI, and LO registers can be used per stream. Partitioning the encoder 102 and the decoder 104 into pipeline stages can be accomplished in multiple ways. First, the PCNT lookup can be partitioned into a number of stages, where in each stage only a range of table entries are considered. For example, the table lookup can be partitioned into two stages, where the first stage considers the first half of entries and the second stage considers the second half. If the first stage results in a match, the second stage can be optionally power gated to reduce energy. In some cases, partitioning may require temporary registers to hold the results produced at each stage. Adjusting the Hi/Lo/CODE can be another stage for the decoder, and generating the Hi/Lo/CODE can be another stage for the encoder. Similarly, the offset generation and offset extraction can be other stages.

Pipelining increases throughput since it reduces the amount of processing that occurs per cycle; thus, permitting a higher operating frequency. Further increases in throughput can be had with replication of the encoder 102 and the decoder 104. This replication can include splitting the input tensor into several subtensors whose stream are to be encoded and decoded independently. Such splitting may be desirable for a number reasons, for example, it is often used to take advantage of locality in the on-chip memory hierarchy. The number of units needed depends on the target application and the number of processing cores.

In some cases, the offset stream can be skewed with shorter offsets being more common. In such cases, the offsets can be non-uniformly distributed, with various bit patterns to appear with different probability. Accordingly, a second level encoder can be used for these purposes. While, in some cases, a first level encoder can capture some of the non-uniformity using a sufficient number of probability count table entries, it may be less efficient.

In some cases, the offset stream can also be encoded by the encoder 102. In a particular case, the resulting encoding with the offset stream can comprise three streams: (a) the symbol stream generated for the values, (b) the symbol stream generated for the offsets, and (c) an offset stream to be added to each symbol generated by (b) to recover the original offset. In this case, a two-level encoder can be used where the output of a first level's offset generator becomes the input to a second level encoder. In this way, the first level encoder writes only the code stream. The second level encoder observes the offset stream as generated by the first level encoder. All offsets can be zero extended to the maximum possible bitlength, and then encoded using the same approach as the values. The output from the second level encoder can be two streams: one containing symbols corresponding to the original offsets, and the other containing new offsets.

In some cases, the encoder 102 can use other encoding approaches to further boost effectiveness. For example, dictionary based methods such as GOBO encode the bulk of values as indexes to a dictionary of representative values. Such indexes are typically 3b to 5b integers. The distribution of these indexes is skewed, and rather than storing the indexes as-is, the above described approach can be used to reduce the footprint of the index array. Example experiments conducted by the present inventors a modified version of GOBO resulted in reducing the index footprint to 79% of its original size.

In order to generate probability count table contents, such as those shown in TABLE 1, a set of probability tables per layer of the machine learning model, one per input tensor, can be generated; where a tensor is an array of values. For each layer of the machine learning model, two separate tables can be generated: one for activations and another for weights. In some cases, profiling can be used for both the weights and the activations such that it is run on one or a few input samples to generate the tables. For tensors that are statically known, such as the weights, and thus are independent of the input, the tables that are generated are identical to those that would have been generated if it was invoked at runtime. For tensors that depend on input, the tables generated would not have been identical to those that would have been generated if it was invoked at runtime; thus, giving a different input. While individual activation values may vary with the input, the overall distribution of the activation tensor generally does not vary substantially. Accordingly, using a profiling approach, where it is applied over a small subset of potential inputs can be sufficient; such as over 10 inputs in the example experiments.

In some cases, table generation can initialize the table with values corresponding to a uniform value distribution and then estimate the resulting footprint; that is the number of bits that would be needed to store the input tensor. The table entries can then be iteratively adjusted in order to attempt to find a better assignment. This adjustment can consider all possible configurations allowed by a search algorithm as long as this results in a reduction in footprint that is above a predefined threshold. In an example, the predefined threshold can be set to 1%. An example of this table generation approach is provided in LISTING 1. Without loss of generality, the example assumes that the inputs are 8b values, however, an input of any bit length can be used. In this example, the input tensor is inspected and a histogram is created with 28 buckets, where each bucket h(i) represents the number of times a corresponding value i appears in the tensor. The findPT( ) routine in invoked, which accepts the histogram as input. The probability count table PT is initialized with a default configuration, where the range of possible values (for example, [0, 28−1]) is equally split among the table entries (line 38 in LISTING 1). The number of entries in PT can be selected as a design parameter. In general, the higher the number of entries, the more accurately the input data distribution can be represented and, depending on the input distribution, the better the compression rate that is to be expected. At the extreme case, for 8b input values, a table of 28 entries would be needed to represent the frequency of each value. Keeping a table with 28 entries for 8 bit values may be, in some cases, prohibitive from a hardware cost and access latency perspective. Thus, for practical implementation, a 16 entry table can be used. In such a table each entry imaps to a continuous sub-range of possible values [$v_{min}$, $v_{max}$]. An example of the default configuration for a PT with 16 entries is shown in TABLE 2.

Listing 1

[1]
[2] N: number of probability count table entries
[3] PT: Probability count table, array [1 . . . N]
[4] histogram: how many times each input value appears, array [0 . . . VALUE_MAX]
[5] depth: integer
[6] around: integer 1 . . . N
[7] DEPTH_MAX: integer, default 2
[8] THRESHOLD: real, default 0.99
[9]
[10] search(histogram, PT, minsize, depth, around)
[11] tryPT=PT
[12] for i=1 to N
[13] If around>=1 and $|$i−around$|$!=1: continue
[14] save=tryPT[i]·v_min
[15] repeat
[16] If i==1: pv_min=0
[17] else: pv_min=tryPT[i−1]·v_min
[18] If tryPT[i]·v_min==pv_min: break
[19] tryPT[i]·v_min−−
[20] If depth>DEPTH_MAX:
[21] PT, minsize=search(histogram, tryPT, minsize, depth+1, i)
[22] else:
[23] trysize=encoded_size(histogram, tryPT)
[24] If try_size<minsize: PT=tryPT, minsize=trysize
[25] tryPT[i]·v_min=save
[26] repeat
[27] If i==N: $nv\_\{min\}$=VALUE_MAX
[28] else: $nv\_\{min\}$=tryPT[i+1]·v_min
[29] If tryPT[i]·v_min==pv_min: break
[30] tryPT[i]·v_min++
[31] If depth>DEPTH_MAX:
[32] PT, best_size=search(histogram, tryPT, minsize, depth+1, i)
[33] else:
[34] try_size=encoded_size(histogram, tryPT)
[35] If try_size<minsize: PT=tryPT, minsize=trysize
[36] tryPT[i]·v_min=save
[37] return PT, minsize
[38] findPT(histogram)
[39] initialize PT to uniform distribution
[40] repeat
[41] size=encoded_size(histogram, PT)
[42] PT, newsize=search(histogram, PT, size, 1, −1)
[43] If newsize/size>=THRESHOLD: break
[44] return PT

TABLE 2

| IDX | V_min | V_max | OL | Count |
|---|---|---|---|---|
| 0 | 0x00 | 0x0F | 4 | $C_0$ |
| 1 | 0x10 | 0x1F | 4 | $C_1$ |
| 2 | 0x20 | 0x2F | 4 | $C_2$ |
| ... | ... | ... | ... | ... |
| 15 | 0xEF | 0xFF | 4 | $C_{15}$ |

Generally, the above-described initial configuration is suitable for uniformly distributed values, which may not be typical in DNN models. The compression opportunity stems from the fact that, in DNNs, the probability distribution of the values is typically very skewed where most of the values are small and cluster around one point in the range of possible values; while only a few are scattered around the extreme ends. The table generation advantageously determines a suitable set of 16 sub-ranges that best represent the input value distribution. Accordingly, the table generation is an iterative approach that starts with the initial default configuration and proceeds to try alternate configurations, each of which are generated by expanding or contracting the sub-ranges. The objective is to minimize the footprint. For this purpose, the number of bits needed to represent the input given a current table configuration is estimated.

Before trying any other configurations for the probability count table, findPT( ) is used to estimate a footprint given the current probability count table PT; as shown in line 41 of LISTING 1. Search( ) is then invoked which searches through candidate configurations and returns the best PT found, and its corresponding footprint. Line 43 of LISTING 1 determines whether an even better configuration will be searched by testing a ratio of the newly found best footprint (newsize) over the previous best footprint (size). As long as this ratio is smaller than a THRESHOLD (0.99 was used), another iteration will be performed and additional PT configurations are considered.

The process used to generate and consider candidate PT configurations is implemented by search( ) in LISTING 1. The inputs are the value histogram, the currently best PT and its footprint (minsize), plus two additional parameters 'depth' and 'around'. The output is the best found PT and its corresponding footprint. If search( ) finds no better PT, it will return the PT and footprint it was called with. The implementation of search uses recursion whose depth is controlled by the 'depth' parameter. When findPT( ) invokes search( ), it can set depth to 1. When search( ) calls itself, it increases depth. As long as depth is less than a maximum allowed value DEPTH MAX, search( ) is allowed to call itself. A maximum depth of 2 was sufficient for the models of this example. The parameter 'around' identifies which PT entry indexes would search try to adjust. If around is negative, then search is allowed to adjust all entries. The only case this occurs is when findPT( ) invokes search( ). Otherwise, around is an index itself and search( ) will try to adjust only entries whose distance from the around is at most within some threshold either below or above. In this example, the threshold is set to 1.

The search( ) process first creates a copy of the input PT and stores it in tryPT (line 11 of LISTING 1). Then the search( ) process iterates over the table indexes 1 to N (line 12 of LISTING 1). If an entry i is allowed to be considered given the value of the around parameter (line 13 of LISTING 1), then the corresponding tryPT entry will be adjusted. The candidate tryPT entry's $v_{min}$ will be decremented if possible. This effectively grows the range covered by entry i. To check whether decrementing is possible, the search( ) process first checks the $v_{min}$ value of the immediately preceding tryPT entry (lines 16-17 of LISTING 1). Decrementing is possible only if the candidate $v_{min}$ is greater than the preceding entry's $v_{min}$ (line 18 of LISTING 1). The candidate $v_{min}$ is decremented (line 19 of LISTING 1). If the search has not reached the maximum depth, it recursively invokes search( ) with around set to i (lines 20-21 of LISTING 1). Otherwise, search( ) estimates the footprint of the tryPT and if that proves smaller than the currently best, it updates the best PT and footprint (lines 22-24 of LISTING 1). Entry i is then restored to its original value (line 25 of LISTING 1). The process then considers, in a similar fashion, table configurations where the $v_{min}$ of entry i is incremented instead (lines 26-35 of LISTING 1). This effectively shrinks the range covered by entry i. At the end, search( ) returns the best PT and footprint it has found.

At each step of its iterative search, table generation can include estimating the number of bits that would be needed to represent the input given the currently considered sub-range collection (calls to encoded size( )). This can be performed as follows:

Considering each value as a discrete random variable X with possible values $x_1, \ldots, x_n$ that occur with probability $P(x_1), \ldots, P(x_n)$ respectively, the entropy of X is:

$$E(X) = -\sum_{i=1}^{n} P(x_i) * \log_2 P(x_i)$$

-continued where:

$$P(x_i) = \text{Count}(x_i) / \sum_{j=1}^{n} \text{Count}(x_j)$$

According to Shannon's entropy theory, the minimum number of bits needed for a symbol representing the value $x_i$ that occurs with probability $P(x_i)$ is defined as:

$$\text{Bits}(x_i) = -\log_2 P(x_i)$$

Profiling can be used to find a mapping that minimizes the collective footprint, in bits, of the profiled data. In the specific example of 8b values and 16-entry table, the default initial mapping can use equally sized sub-ranges of length 28/16=16. Thus, the offset length OL is 4b for all the entries in the initial mapping as shown in TABLE 2. For an entry i, the Count column is the sum of the counts of the values falling within the range [$v_{min}$ and $v_{max}$], i.e.:

$$C_i = \sum_{x=v_{min}(i)}^{x=v_{max}(i)} \text{Count}(x)$$

A value x falling within the range of entry i is encoded as (symbol, offset), where the offset is of length $OL_i$ bits, and the bit length of the symbol $S_i$ will be proportional to its probability as per Shannon's entropy theory:

$$\text{Bits}(S_i) = -\log_2 P(S_i) = -\log_2 \left( C_i / \sum_{j=0}^{15} C_j \right)$$

Thus, for a specific DNN layer, the overall footprint of the data being profiled given a specific table configuration can be defined as follows:

$$\text{TotalBits} = \sum_{i=0}^{15} C_i * [\text{Bits}(S_i) + OL_i]$$

After the $v_{min}$ values are decided, they can be used to map probability counts. The range of probability counts [0 . . . 2m], where m can be a design parameter (in an example, m=10), are partitioned proportional to the frequency of the values in the corresponding range.

As explained, profiling can be used to generate a probability count table to be used for activations. When using profiling, it is possible that some values will not appear. However, just because a certain value did not appear when processing a limited set of input does not guarantee that these values will not appear when processing some other input. The probability count table can be adjusted if these values are not covered by any of the ranges of the table. When this occurs, table entries can be generated that have zero range (vmin=vmax). Accordingly, as a post processing step for tensors that are not static, the table can be adjusted by increasing the $v_{max}$ (or decreasing the $v_{min}$) of such entries and "stealing" one probability count from any of other entries whose probability count is more than 2.

In example experiments conducted by the present inventors, the effectiveness of the system 100 was determined over a set of DNN models spanning a wide range of applications; including image classification, object detection, segmentation, and natural language processing. The models evaluated are listed in TABLE 3. All models were quantized to 8b. The only exception was ResNet18-PACT, where values were quantized to 4b except for the first layer that needs 8b precision.

TABLE 3

| Network | Dataset | Application | Data Type | Pruned |
|---|---|---|---|---|
| BERT | MRPC | NLP | int8 | |
| Bilstm | Flickr8k | Captioning | int8 | |
| NCF | ml-20m | Recommendation | int8 | |
| SegNet | CamVid | Segmentation | int8 | |
| ResNet18-Q | ImageNet | Classification | int8 | |
| SSD-MobileNet | COCO | Object Detection | int8 | |
| MobileNet | ImageNet | Classification | int8 | |
| ResNet18-PACT | ImageNet | Classification | int4/int8 | |
| AlexNet-Eyeriss | ImageNet | Classification | int8 | Yes |
| GoogLeNet-Eyeriss | ImageNet | Classification | int8 | Yes |

TABLE 4 shows the reduction in overall footprint for several models using the present embodiments. Depending on the quantization approach, the compression ratios vary considerably from as little as 0.83 to as high as 0.30. Regardless of the quantization approach used, the system 100 is able to deliver benefits without having to be purpose-built.

TABLE 4

| Network | Relative Footprint |
|---|---|
| bilstm | 0.44 |
| GoogLeNet-Eyeriss | 0.30 |
| MobileNet | 0.69 |
| NCF | 0.83 |
| BERT | 0.47 |
| ResNet18-Q | 0.31 |
| ResNet18-PACT | 0.72 |

TABLE 5 provides a detailed view of the compression possible with the system 100 for one of the machine learning models (BILS™). The compression ratios vary considerably across the layers and generally tend to be higher for the activations. The system 100 takes advantage of the highly skewed distribution of the activation tensors, which tend to be biased towards zero.

TABLE 5

| BILSTM | | |
|---|---|---|
| Tensor-Layer | Relative Footprint | Original % |
| All | 0.44 | |
| act-conv1-0 | 0.76 | 0.115 |
| act-conv2-0 | 0.35 | 0.052 |
| act-conv3-0 | 0.24 | 0.032 |
| act-conv4-0 | 0.13 | 0.048 |
| act-conv5-0 | 0.15 | 0.048 |
| act-fc6-0 | 0.13 | 0.007 |
| act-fc7-0 | 0.07 | 0.003 |
| act-fc8-0 | 0.13 | 0.003 |
| act-lstm1_backward-0 | 0.3 | 0.015 |
| act-lstm1_forward-0 | 0.35 | 0.015 |
| act-lstm2_backward-0 | 0.4 | 0.015 |
| act-lstm2_forward-0 | 0.4 | 0.015 |
| act-predict_backward-0 | 0.32 | 0.015 |
| act-predict_forward-0 | 0.43 | 0.015 |
| wgt-conv1 | 0.63 | 0 |
| wgt-conv2 | 0.47 | 0.002 |
| wgt-conv3 | 0.65 | 0.007 |

TABLE 5-continued

| BILSTM | | |
|---|---|---|
| Tensor-Layer | Relative Footprint | Original % |
| wgt-conv4 | 0.67 | 0.005 |
| wgt-conv5 | 0.68 | 0.003 |
| wgt-fc6 | 0.56 | 0.281 |
| wgt-fc7 | 0.35 | 0.125 |
| wgt-fc8 | 0.31 | 0.03 |
| wgt-lstm1_backward-0 | 0.54 | 0.03 |
| wgt-lstm1_forward-0 | 0.42 | 0.03 |
| wgt-lstm2_backward-0 | 0.29 | 0.03 |
| wgt-lstm2_forward-0 | 0.29 | 0.03 |
| wgt-predict_backward-0 | 0.3 | 0.015 |
| wgt-predict_forward-0 | 0.43 | 0.015 |

The example experiments verified that the system 100 can achieve substantial improvements in (1) compression ratios for both model weights and runtime activation, and (2) energy savings with the compressed off-chip traffic to/from DRAM. Energy results in the example experiments assume a dual-channel DDR4-3200 off-chip memory with total capacity of 16 GB. In the example experiments, 32 compression+32 decompression engines were modelled.

The results of the example experiments showed that the system 100 needs a total area of 1.14 mm2 and consumes a total average power of 179.2 mW. This power consumption constitutes 4.7% overhead of the power consumed by a dual-channel DDR4-3200 memory system saturated at 90% of its peak bandwidth.

Figure 13:
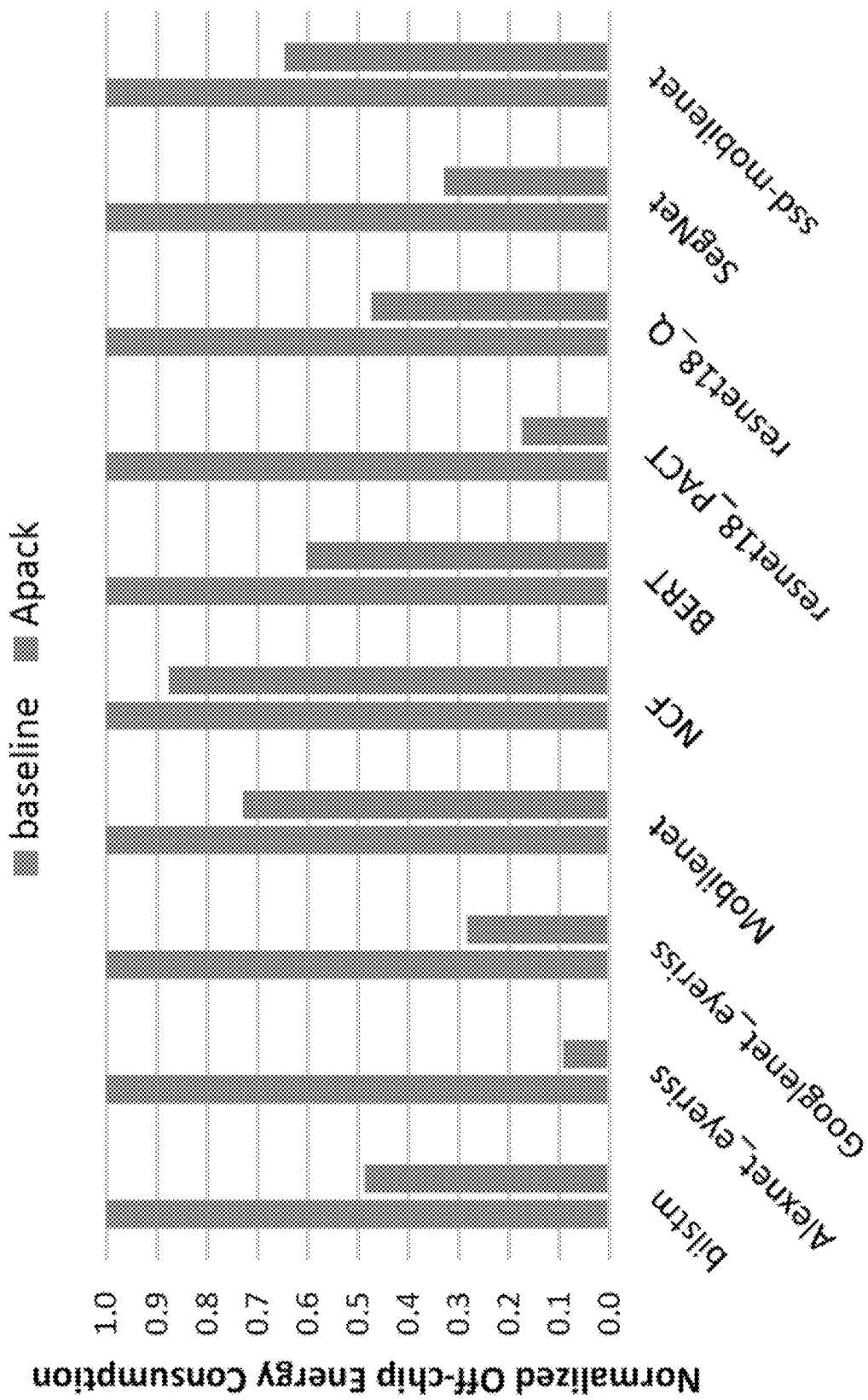
FIG. 13 is a chart showing, for DNN model weights, an example of energy consumed by off-chip memory transfers normalized to a baseline that implements no compression technique.
Figure 14:
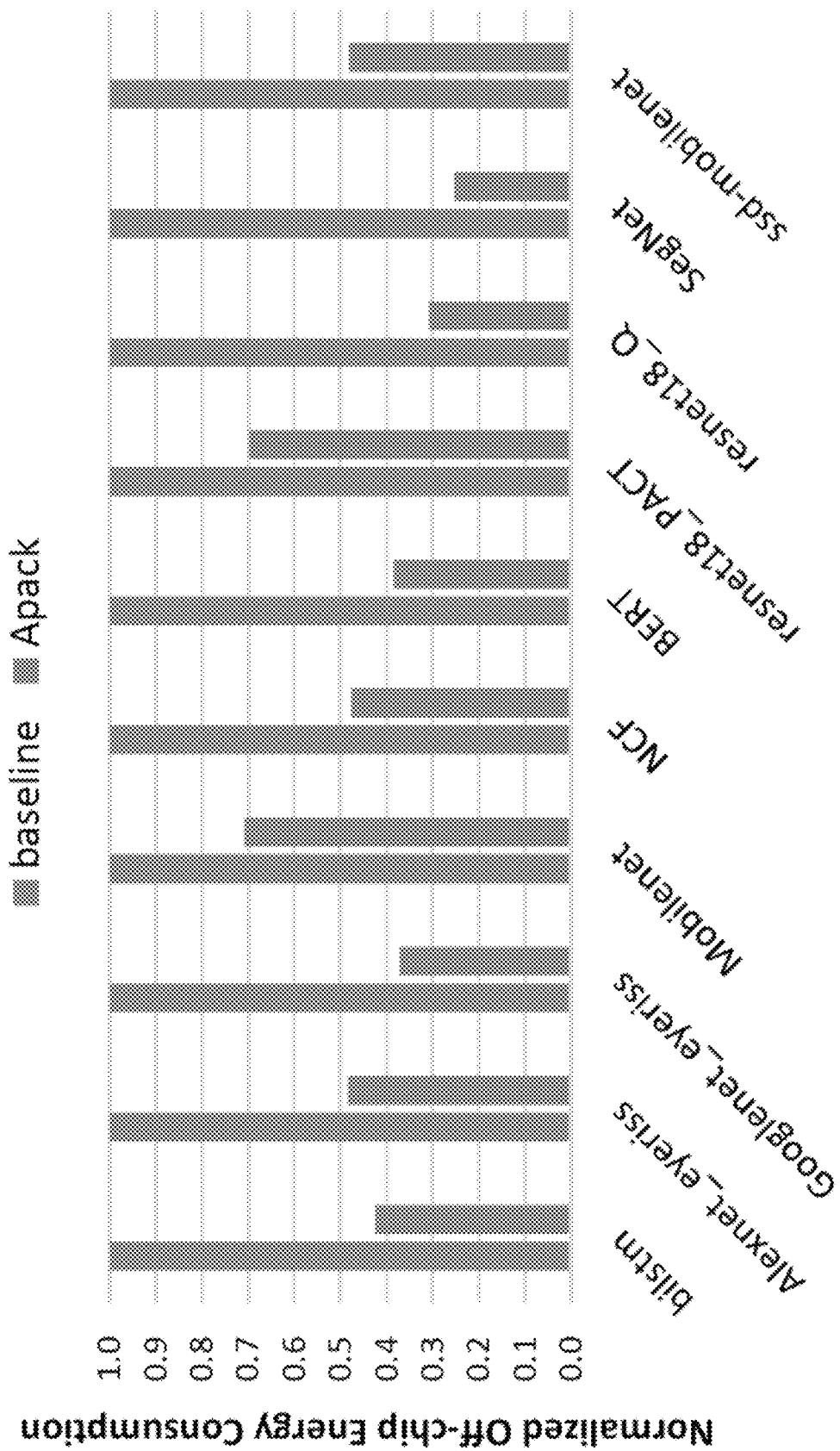
FIG. 14 is a chart showing, for DNN model runtime activations, an example of energy consumed by off-chip memory transfers normalized to a baseline that implements no compression technique.

For DNN model weights and runtime activations, respectively, FIG. 13 and FIG. 14 show the energy consumed by off-chip memory transfers normalized to a baseline that implements no compression technique. The estimates shown assume that the weights and input activations of each layer are read only once from off-chip. As FIG. 13 and FIG. 14 show, energy savings vary across models according to the compression ratio achievable. For instance, pruned models, such as AlexNet-Eyeriss and GoogLeNet-Eyeriss, where most of the model weights are zeros, the system 100 capitalizes on the very skewed values distribution and saves 91% and 72% of the off-chip access energy, respectively. For models with a less skewed values distribution, i.e., almost uniform distribution, such as NCF APack, the system 100 achieves lower compression ratio (1.2×) and thus saves 13% of the off-chip energy consumption. However, the same model can have more skewed distribution for its runtime activations. For example, the compression ratio for NCF activations is 2.2× leading to energy savings of 53%. On average over all models, the system 100 reduces the energy consumption of model weights and runtime activations by 61% and 57% respectively.

As evidenced in the example experiments, the system 100 provides a simple to implement and effective off-chip compression approach for machine learning models that is plug-in compatible with many accelerators. The example experiments demonstrate that it reduces off-chip traffic, which significantly reduces energy consumed by expensive off-chip memory transfers. In addition, the system 100 can accelerate memory-bound models by reducing the stalls related to off-chip data accesses.

Advantageously, the present embodiments can use heuristics to partition a value space into prefix groups to maximize compression ratio. In this way, the present embodiments can exploit the memory access parallelism of machine learning workloads to replicate and operate several encoder/decoder units in parallel. Combined with the ability to pipeline these units so that they can be time multiplexed across several data streams, the present embodiments can keep up with data bandwidth demands of target workloads. In some cases, the system 100 can be placed just before an off-chip memory controller, where it can act transparently to the rest of the on-chip system. The rest of the on-chip memory and compute units can thus see the original data stream. As a result, the present embodiments can be used with many machine learning accelerators; such as vector-like or tensorcore units, systolic arrays, and units that process sparse tensors. In further cases, the encoding and decoding can be performed by other aspects of the computing system, such as executed on a central-processing unit or other processor.

Although the foregoing has been described with reference to certain specific embodiments, various modifications thereto will be apparent to those skilled in the art without departing from the spirit and scope of the invention as outlined in the appended claims.

The invention claimed is:

1. A method for compression and decompression of a data stream used by machine learning networks, the data stream comprising weight data or activation data used by the machine learning networks, the method comprising:
    receiving the data stream to be encoded;
    encoding each value in the data stream, comprising:
        determining a mapping to one of a plurality of non-overlapping ranges, each value encoded as a symbol representative of the range and a corresponding offset; and
        arithmetically coding the symbol using a probability count;
    storing a compressed data stream comprising the arithmetically coded symbols and the corresponding offsets; and
    decoding the compressed data stream with arithmetic decoding using the probability count, the arithmetic decoded symbols are used with the offset bits to arrive at a decoded data stream; and
    communicating the decoded data stream for use by the machine learning networks.

2. The method of claim 1, wherein the probability count is represented by a range of values representing an approximate frequency of occurrence for the symbol in an input sample.

3. The method of claim 2, wherein the probability counts are initialized with a uniform value distribution.

4. The method of claim 2, wherein the probability count in the input sample is used to determine the non-overlapping ranges.

5. The method of claim 1, wherein encoding each value in the data stream comprises encoding multiple values simultaneously using pipelining, and wherein decoding the compressed data stream comprises decoding multiple values simultaneously using pipelining.

6. The method of claim 5, wherein the data stream comprises a tensor and wherein the method further comprises splitting the tensor into several subtensors, each subtensor encoded and decoded in a respective pipeline.

7. The method of claim 1, further comprising encoding the corresponding offsets using two-level encoding.

8. The method of claim 1, wherein each of the non-overlapping ranges is defined by a respective minimum value, maximum value, and offset length.

9. The method of claim 8, wherein the non-overlapping ranges are ordered and the maximum value of each range is the minimum value minus one of the next range in the order.

10. The method of claim 1, wherein the symbol comprises a minimum value for the mapped range, and wherein the corresponding offset comprises the minimum value for the mapped range subtracted from the value from the data stream.

11. The method of claim 1, wherein encoding each value in the data stream comprises using profiling to determine the probability counts for activation data.

12. A system for compression and decompression of a data stream used by machine learning networks, the data stream comprising weight data or activation data used by the machine learning networks, the system comprising:
    one or more encoders to receive the data stream to be encoded and encode each value in the data stream, the encoding comprising:
        determining a mapping to one of a plurality of non-overlapping ranges, each value encoded as a symbol representative of the range and a corresponding offset; and
        arithmetically coding the symbol using a probability count;
    a memory storage for storing a compressed data stream comprising the arithmetically coded symbols and the corresponding offsets; and
    one or more decoders to decode the compressed data stream with arithmetic decoding using the probability count, the decoder uses the arithmetic decoded symbols and the offset bits to arrive at a decoded data stream, and to communicate the decoded data stream for use by the machine learning networks.

13. The system of claim 12, wherein the probability count is represented by a range of values representing an approximate frequency of occurrence for the symbol in an input sample.

14. The system of claim 13, wherein the probability counts are initialized with a uniform value distribution.

15. The system of claim 13, wherein probability count in the input sample is used to determine the non-overlapping ranges.

16. The system of claim 12, wherein multiple values in the data stream are encoded simultaneously by each of a plurality of the encoders, and wherein multiple values in the compressed data stream are decoded simultaneously by each of a plurality of the decoders.

17. The system of claim 16, wherein the data stream comprises a tensor and wherein the method further comprises splitting the tensor into several subtensors, each subtensor encoded by a separate encoder and decoded by a separate decoder.

18. The system of claim 12, wherein the encoder further encodes the corresponding offsets using two-level encoding.

19. The system of claim 12, wherein each of the non-overlapping ranges is defined by a respective minimum value, maximum value, and offset length.

20. The system of claim 19, wherein the non-overlapping ranges are ordered and the maximum value of each range is the minimum value minus one of the next range in the order.

21. The system of claim 12, wherein the symbol comprises a minimum value for the mapped range, and wherein the corresponding offset comprises the minimum value for the mapped range subtracted from the value from the data stream.

22. The system of claim 12, wherein the encoder uses profiling to determine the probability counts for activation data.

* * * * *